US010224499B2

(12) United States Patent
Wu et al.

(10) Patent No.: US 10,224,499 B2
(45) Date of Patent: Mar. 5, 2019

(54) BIOMOLECULE-CARBON NANOSTRUCTURE NANOCOMPOSITES FOR OPTOELECTRONIC DEVICES

(71) Applicant: University of Kansas, Lawrence, KS (US)

(72) Inventors: Judy Z. Wu, Lawrence, KS (US); Youpin Gong, Lawrence, KS (US); Qingfeng Liu, Lawrence, KS (US)

(73) Assignee: UNIVERSITY OF KANSAS, Lawrence, KS (US)

( * ) Notice: Subject to any disclaimer, the term of this patent is extended or adjusted under 35 U.S.C. 154(b) by 0 days.

(21) Appl. No.: 15/547,914

(22) PCT Filed: Jan. 29, 2016

(86) PCT No.: PCT/US2016/015632
§ 371 (c)(1),
(2) Date: Aug. 1, 2017

(87) PCT Pub. No.: WO2016/126542
PCT Pub. Date: Aug. 11, 2016

(65) Prior Publication Data
US 2018/0019422 A1 Jan. 18, 2018

Related U.S. Application Data
(60) Provisional application No. 62/110,739, filed on Feb. 2, 2015.

(51) Int. Cl.
*H01L 51/42* (2006.01)
*H01L 51/00* (2006.01)
(Continued)

(52) U.S. Cl.
CPC ........... *H01L 51/4253* (2013.01); *G01J 1/44* (2013.01); *H01L 31/0288* (2013.01); (Continued)

(58) Field of Classification Search
CPC ............. H01L 51/4253; H01L 31/0288; H01L 51/0093; H01L 29/1606; H01L 31/06; H01L 31/1136; G01J 1/44
See application file for complete search history.

(56) References Cited

U.S. PATENT DOCUMENTS 7,982,130 B2   7/2011   Forrest et al.
8,027,824 B2   9/2011   Deb
(Continued)

FOREIGN PATENT DOCUMENTS

WO   WO2011024633   3/2011

OTHER PUBLICATIONS

Boussaad et al., In situ detection of cytochrome c adsorption with single walled carbon nanotube device, May 20, 2003, Chem. Comm., pp. 1502-1503.*
(Continued)

*Primary Examiner* — Christine S Kim
(74) *Attorney, Agent, or Firm* — Bell & Manning, LLC

(57) ABSTRACT

An optoelectronic device comprises a nanocomposite comprising a carbon nanostructure having a surface and a biomolecule adsorbed on the surface and forming a heterojunction at the interface of the carbon nanostructure and the biomolecule, the carbon nanostructure and the biomolecule each characterized by respective conduction band edges and valence band edges. The device further comprises first and second electrodes in electrical communication with the nanocomposite. The conduction band edge offset, the valence band edge offset, or both, across the heterojunction is greater in energy than the binding energy of an exciton generated in the carbon nanostructure or the biomolecule upon the absorption of light such that the exciton dissociates at the heterojunction to an electron, which is injected into one of the carbon nanostructure and the biomolecule, and a
(Continued)

hole, which is injected into the other of the carbon nanostructure and the biomolecule.

21 Claims, 30 Drawing Sheets

(51) Int. Cl.
| | |
|---|---|
| *G01J 1/44* | (2006.01) |
| *H01L 31/0288* | (2006.01) |
| *H01L 29/16* | (2006.01) |
| *H01L 31/06* | (2012.01) |
| *H01L 31/113* | (2006.01) |

(52) U.S. Cl.
CPC ...... *H01L 51/0048* (2013.01); *H01L 51/0093* (2013.01); *H01L 51/4206* (2013.01); *H01L 29/1606* (2013.01); *H01L 31/06* (2013.01); *H01L 31/1136* (2013.01); *Y02E 10/549* (2013.01)

(56) References Cited

U.S. PATENT DOCUMENTS

2012/0277414 A1 11/2012 Yamada et al.
2013/0264542 A1 10/2013 Wu et al.

OTHER PUBLICATIONS

Katz et al., Biomolecule-Functionalized Carbon Nanotubes: Applications in Nanobioelectronics, 2004, ChemPhysChem, vol. 5, pp. 1084-1104.*
Matsui et al., Adsorption of cytochrome c on nanoshell carbon, Carbon 49, Jun. 21, 2011, pp. 4505-4510.
Gong et al., Wrapping cytochrome c around single-wall carbon nanotube: engineered nanohybrid building blocks for infrared detection at high quantum efficiency, Scientific Reports 5:11328, Jun. 11, 2015, pp. 1-9.
Zhao et al., A Reagentless Biosensor of Nitric Oxide Based on Direct Electron Transfer Process of Cytochrome C on Multi-Walled Carbon Nanotube, Frontiers in Bioscience 10, Feb. 2005, pp. 2005-2010.
K. Deb, A protein microbolometer for focal plane arrays, Mat Res Innovat 2, 1999, pp. 318-320.
K. Deb, Protein-Based Thin Films: A New High-TCR Material, Sensors, Aug. 2000, pp. 1-6.
K. Deb, Update: a protein microbolometer for focal plane arrays, Mat Res Innovat 3, 1999, pp. 66-68.
Lai et al., Long-Wavelength Infrared Sensing by Cytochrome C Protein, Sensors, vol. 13, No. 11, Nov. 14, 2013, pp. 15833-15845.
Lai et al., Microbolometer SU-8 photoresist microstructure with cytochrome c protein as a sensing pixel for microbolometer, Proceedings of SPIE, the International Society for Optical Engineering, vol. 8512, 2012.
Lai et al., Using an SU-8 Photoresist Structure and Cytochrome C Thin Film Sensing Material for a Microbolometer, Sensors, vol. 12, Nov. 27, 2012, pp. 16390-16403.
Saifuddin et al., Carbon Nanotubes: A Review on Structure and Their Interaction with Proteins, Journal of Chemistry, Article ID 676815, 2013.
International Search Report and Written Opinion mailed in PCT/US2016/015632, dated Apr. 5, 2016.
Lu, Extraordinary Photocurrent Harvesting at Type-II Heterojunction Interfaces: Toward High Detectivity Carbon Nanotube Infrared Detectors, Nano Letters, vol. 12, No. 12, 2012, pp. 6244-6249.
Bindl, Dissociating Excitons Photogenerated in Semiconducting Carbon Nanotubes at Polymeric Photovoltaic Heterojunction Interfaces, ACS Nano, vol. 4, No. 10, 2010, pp. 5657-5664.
International Preliminary Report on Patentability mailed in PCT/US2016/015632, dated Aug. 17, 2017.

* cited by examiner

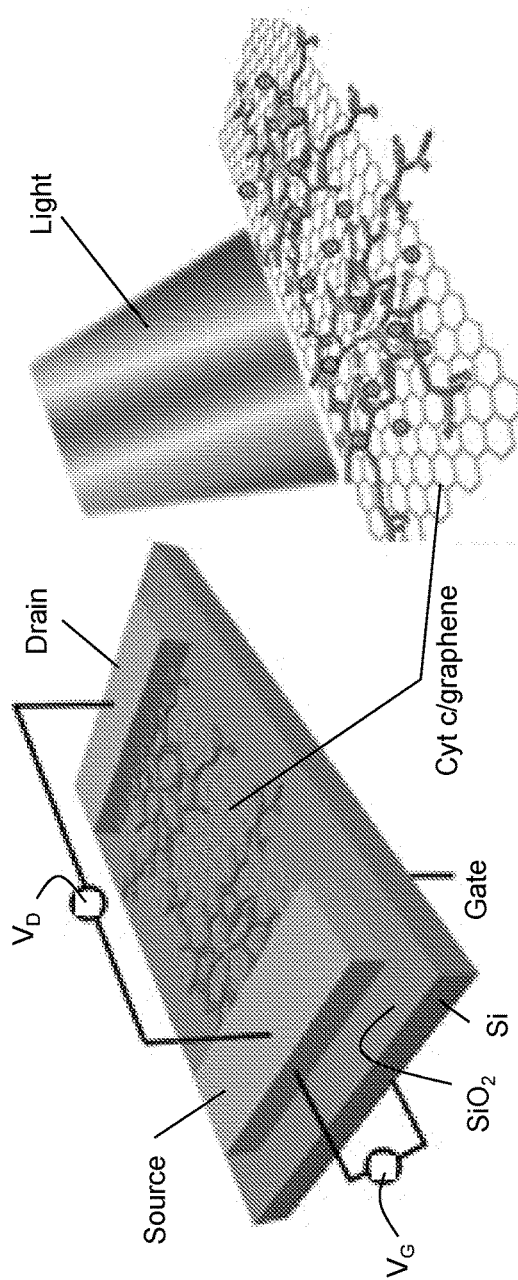
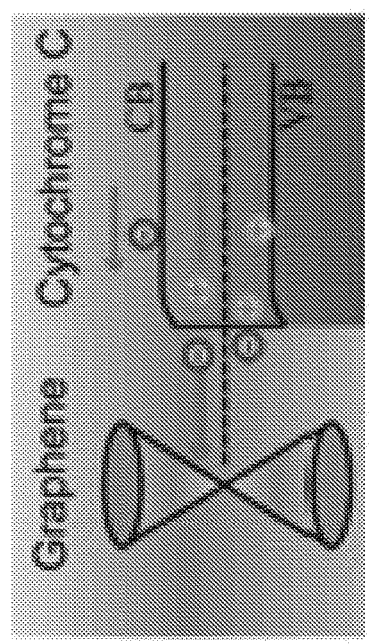
FIG. 14A
FIG. 14B
FIG. 14C

BIOMOLECULE-CARBON NANOSTRUCTURE NANOCOMPOSITES FOR OPTOELECTRONIC DEVICES

CROSS-REFERENCE TO RELATED APPLICATIONS

The present application is a National Stage of International Application No. PCT/US2016/015632 that was filed Jan. 29, 2016, which claims the benefit of U.S. Provisional Patent Application No. 62/110,739 that was filed Feb. 2, 2015, the contents of which are herein incorporated by reference.

REFERENCE TO GOVERNMENT RIGHTS

This invention was made with government support under DMR1105986 and EPS0903806 awarded by the National Science Foundation and W911NF-12-1-0412 awarded by the Army Research Office. The government has certain rights in the invention.

BACKGROUND

Single-walled carbon nanotubes (SWCNTs) have superior photoresponse in the infrared (IR) spectrum and outstanding potential for nanoscale optoelectronic applications with extraordinary performance in addition to the benefits of low cost, large abundance, and light weight. However, the photoexcited electron-hole pairs (or excitons) in SWCNTs have an unusually high binding energy on the order of few hundreds meV due to the much enhanced Coulomb interaction and much reduced screening effect characteristic to low-dimensional systems (e.g., one-dimensional systems like SWCNTs), which seriously hinders the dissociation of excitons into photocurrents. However, a nanohybrid photoconductor based on SWCNTs (s-SWCNTs) and conjugated semiconductor Poly(3-hexylthiophene) polymer (P3HT) has been made, exhibiting a high photoresponsivity of $R_f \sim 2.2$ mAW$^{-1}$ to near infrared light (NIR), and a high detectivity $D^*$ of $2.3 \times 10^8$ cm Hz$^{1/2}$W$^{-1}$. (See, Lu, R. T., Christianson, C., Kirkeminde, A., Ren, S. Q. & Wu, J. Extraordinary photocurrent harvesting at type-II heterojunction interfaces: Toward high detectivity carbon nanotube infrared detectors. *Nano Lett.* 12, 6244-6249 (2012).) While this result is exciting, the external quantum efficiency (EQE) of these devices was below 2%. (Id.)

SUMMARY

Disclosed are biomolecule-carbon nanocomposites. Also disclosed are films and optoelectronic devices comprising the nanocomposites. Also provided are methods for making and using the nanocomposites, films and optoelectronic devices.

In one aspect, an optoelectronic device comprises a nanocomposite comprising a carbon nanostructure having a surface and a biomolecule adsorbed on the surface of the carbon nanostructure and forming a heterojunction at the interface of the carbon nanostructure and the biomolecule, the carbon nanostructure and the biomolecule each characterized by respective conduction band edges and valence band edges; a first electrode in electrical communication with the nanocomposite; and a second electrode in electrical communication with the nanocomposite, wherein the conduction band edge offset, the valence band edge offset, or both, across the heterojunction is greater in energy than the binding energy of an exciton generated in the carbon nanostructure or the biomolecule upon the absorption of light such that the exciton dissociates at the heterojunction to an electron, which is injected into one of the carbon nanostructure and the biomolecule, and a hole, which is injected into the other of the carbon nanostructure and the biomolecule.

In another aspect, a method of using the optoelectronic device described above comprises illuminating the optoelectronic device with light and separately collecting the electron and the hole via the first and second electrodes.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1A shows a schematic of an s-SWCNT/Cyt c building block with Cyt c adsorbed and wrapping around a CNT. FIG. 1B shows an AFM image of individual s-SWCNT/Cyt c building blocks dispersed on a SiO$_2$/Si substrate. The inset shows the cross section profiles of two s-SWCNT/Cyt c building blocks under the marked dotted line in FIG. 1B. FIG. 1C shows optical absorbance spectra of the pure Cyt c and the s-SWCNT/Cyt c nanohybrid solutions, including s-SWCNT of different purities. FIG. 1D shows schematic diagrams of s-SWCNT/Cyt c nanohybrid films (upper) and the band edge offset across the s-SWCNT/Cyt c interface (lower) for exciton dissociation. FIG. 1E shows a diagram of the IR photodetector device schematic on SiO$_2$ (90 nm)/Si substrate with two Au/Ti electrodes of spacing of 0.35 mm.

FIG. 2A plots the electric current of the s-SWCNT/Cyt c devices under dark and NIR illumination as a function of bias voltage at various incident NIR power density from 15 to 350 mW/cm$^2$. FIG. 2B shows the bias voltage dependence of the photoresponsivity at various incident NIR power density from 15 to 350 mW/cm$^2$. FIG. 2C plots the external quantum efficiency as a function of incident NIR power density. The inset shows the quantum efficiency versus bias voltage under 15 mW/cm$^2$ NIR light. FIG. 2D plots the normalized photocurrent-to-dark current ratio (NPDR) as function of the bias voltage.

FIG. 3A shows a comparison of root-mean-square noise currents for nanohybrid s-SWCNT/Cyt c and pure Cyt c devices at different bias voltages. FIG. 3B shows the bias voltage dependence of detectivity under incident NIR power density of 15 mW/cm$^2$. The inset shows the best detectivity of the pure Cyt c devices versus bias voltage under incident NIR power density of 100 mW/cm$^2$. FIG. 3C plots the detectivity at 6 and 14 V bias voltage as functions of incident NIR power density. The inset plots the detectivity of the pure Cyt c devices versus incident NIR power density.

FIG. 14A shows a schematic of a Cyt c-doped graphene field-effect transistor (GFET). FIG. 14B illustrates the absorption of light by the Cyt c-doped graphene. FIG. 14C shows the energy band structure and band edge offset across the Cyt c/graphene interface based on the measured HOMO and LUMO positions of Cyt c and the reported electronic structure of graphene.

DETAILED DESCRIPTION

Disclosed are biomolecule-carbon nanocomposites. Also disclosed are films and optoelectronic devices comprising the nanocomposites. Also provided are methods for making and using the nanocomposites, films and optoelectronic devices.

The present invention is based, at least in part, on the pairing of certain biomolecules, e.g., cytochrome c (Cyt c), which is a highly efficient electron conductor, with carbon nanostructures, which are also highly efficient electron conductors. The efficient charge conduction in both components of the nanocomposites facilitates multi-scale control of the optoelectronic process of light absorption, exciton dissociation, charge transfer and transport for extraordinary performance in low-cost quantum optoelectronic devices.

A biomolecule-carbon nanocomposite comprises a carbon nanostructure having a surface (e.g., an outer surface) and a biomolecule adsorbed on the surface of the carbon nanostructure, wherein a heterojunction is formed at the interface of the carbon nanostructure and the biomolecule. Each component of the nanocomposite (i.e., the biomolecule and the carbon nanocomposite) may be characterized by a conduction band edge, a valence band edge and a band gap. The heterojunction may be configured to facilitate the dissociation of an exciton (i.e., an electron-hole pair) which has been generated in the carbon nanostructure via the absorption of light. The heterojunction may also be configured to facilitate the subsequent injection of a carrier of a first type (e.g., the electron from the dissociated exciton) into one of the biomolecule and the carbon nanostructure and the carrier of a second type (e.g., the hole from the dissociated exciton) into the other of the biomolecule and the carbon nanostructure. The alignment of the band edges (of the carbon nanostructure and the biomolecule) at the interface and the band edge offset determine the functionality of the heterojunction. As further described below, the heterojunction configured to facilitate exciton dissociation and subsequent carrier injection may be achieved by selecting a particular biomolecule having a particular conduction band edge and valence band edge as compared to a selected carbon nanostructure. Other characteristics of the biomolecule which facilitate exciton dissociation and subsequent carrier injection are discussed below.

Figure 11:
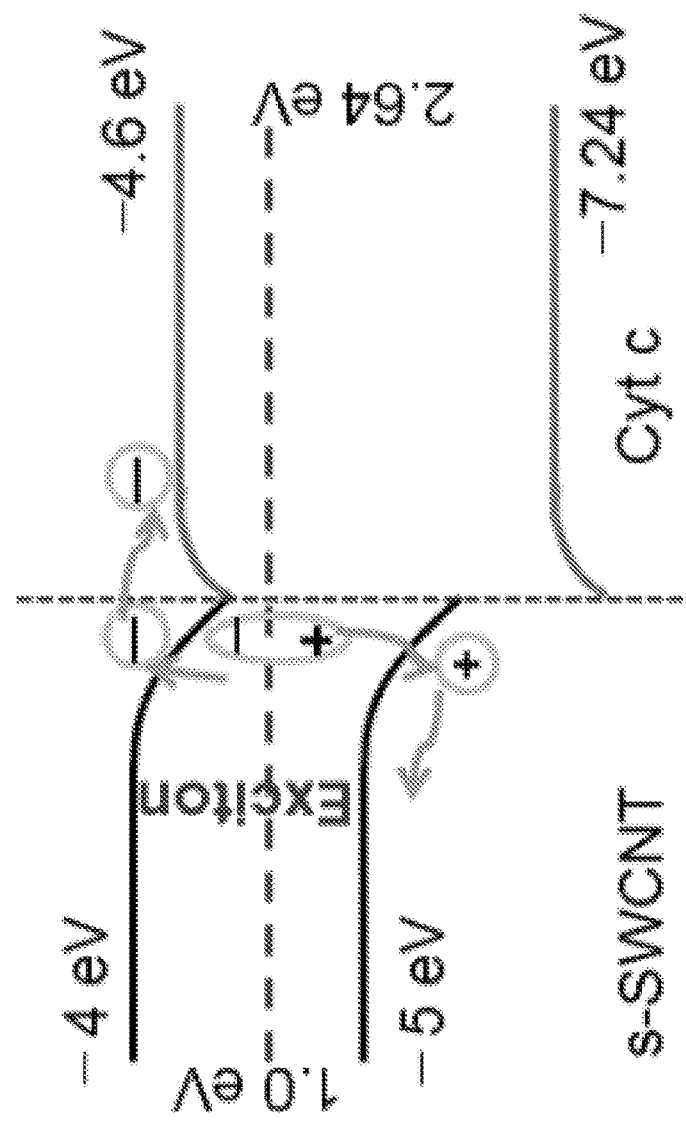
FIG. 11 shows the band-edge offset across the heterojunction formed at the s-SWCNT/Cyt c interface for exciton dissociation based on the measurement of FIG. 9.

The heterojunction may be characterized by the band edge offset at or across the interface of the biomolecule and carbon nanostructure, which arises due to the difference in the energies of the conduction band edge and valence band edge of the carbon nanostructure as compared to the conduction band edge and valence band edge of the biomolecule. The term "band edge offset" may refer to the conduction band offset, the valence band offset, or both. As illustrated in FIG. 11 (s-SWCNT/Cyt c), FIG. 14C (graphene/Cyt c) and FIG. 15B (MWCNT/Cyt c), the conduction band edges and the valence band edges of the two carbon nanostructures have a different energy (relative to $E_F$) as compared to the conduction band edge and valence band edge of the biomolecule, thereby resulting in both a conduction band offset and a valence band offset in the biomolecule-carbon nanostructure nanocomposites. The magnitude of the band edge offset may be greater in energy than the binding energy of the exciton generated in the carbon nanostructure. The particular magnitude of the band edge offset depends upon the type of carbon nanostructure selected for the nanocomposite. Exciton binding energy in conventional semiconductors is in the range of a few meV. However, when a dimension of the semiconductor is reduced to a few nm, the exciton binding energy increases due to increased Coulomb interaction and reduced dielectric screening. For example, the binding energy of an exciton generated in a SWCNT may be in the range of about 300 to 500 meV. In some embodiments, the band edge offset is at least 1.5, 2, 3, 4, 5, etc. times greater in energy than the binding energy of the exciton generated in the carbon nanostructure. Larger band edge offsets as compared to the exciton binding energy generated in the carbon nanostructure increases the efficiency of exciton dissociation. The band edge offset may be experimentally determined using ultrafast photoemission spectroscopy (UPS). The band edge offset may also be theoretically calculated using ab initio simulations.

The heterojunction may be characterized by the alignment of the conduction band edges and the valence band edges of the biomolecule and the carbon nanostructure at or across the interface. The alignment of the conduction band edges may be such that the conduction band edge of the biomolecule may be lower in energy than the conduction band edge of the carbon nanostructure. The alignment of the valence band edges may be such that the valence band edge of the biomolecule is lower in energy than the valence band edge of the carbon nanostructure. Other alignments may be used.

Biomolecules which may be used in the disclosed nanocomposites include molecules which are present in living organisms (although the biomolecules may be man-made) or are substantially derived from molecules which are present in living organisms and which are capable of forming the heterojunctions with carbon nanostructures as described above. The phrase "substantially derived" is meant to encompass biomolecules which are present living organisms, e.g., proteins, but which may have been modified, e.g., with a non-natural chemical variation, e.g., addition, deletion, and/or change of an amino acid(s). Such a variation may have a significant consequence in the functionality of the modified biomolecule, but the chemical structure of the modified biomolecule will still be sufficiently similar to the natural biomolecule that the modified biomolecule will be recognized as originating from the natural biomolecule present in the living organism. Whether the selected biomolecule is a biomolecule capable of forming such heterojunctions (as well as confirmation of the existence of the heterojunctions described above in a particular nanocomposite) may be determined by characterizing the photoresponsivity characteristics of the nanocomposite as described in the Examples below. Illustrative characteristics which render biomolecules capable of forming, or facilitate the formation of, such heterojunctions are described below. Other desirable characteristics for the biomolecules are also described below.

Biomolecules for the disclosed nanocomposites include those having a chemical structure which renders them capable of adsorbing to the surface of the carbon nanostructure through covalent or non-covalent interactions (e.g., van der Waals interactions) to form the heterojunction. This includes biomolecules having a chemical structure which renders them capable of adsorbing to the surface of the carbon nanostructure through π-π stacking interactions.

Biomolecules for the disclosed nanocomposites include those having a chemical structure and/or physical structure which maximizes the number of covalent/non-covalent interactions between the biomolecule and the carbon nanostructure. Biomolecules having a linear, chain-like physical structure may be used. Such biomolecules may be characterized by aspect ratios (length divided by width or diameter) which are greater than 1, greater than 5, greater than 10, etc. For example, the width or diameter of such biomolecules may be on the order of a nm or less (e.g., 0.1, 0.5, 1 nm, etc.) The length of such biomolecules, while greater than the width/diameter of the biomolecules, is not particularly limited. For proteins, the linearity of the protein may refer to the primary or secondary structure of the protein (i.e., as opposed to the tertiary or quaternary structure of the protein). Linear, chain-like biomolecules which are capable of wrapping, e.g., helically wrapping, around cylindrical carbon nanostructures, may be used. Biomolecules having other physical structures may be used.

Biomolecules for the disclosed nanocomposites include those having a chemical structure and/or physical structure which allows carriers (i.e., electrons or holes) to be relatively efficiently conducted along the biomolecules. The ability of a particular biomolecule to conduct carriers may be characterized by the carrier mobility exhibited by the biomolecule. Biomolecules exhibiting a carrier mobility at room temperature of at least 0.1 $cm^2(V \cdot s)$, at least 1 $cm^2$ $(V \cdot s)$, 10 $cm^2(V \cdot s)$ may be used. This includes biomolecules exhibiting a carrier mobility at room temperature of about 0.1 $cm^2(V \cdot s)$ to about 10 $cm^2(V \cdot s)$, etc.

Biomolecules for the disclosed nanocomposites include those which are substantially soluble in water or aqueous solutions at room temperature.

Biomolecules for the disclosed nanocomposites may include those which exhibit certain light absorption/transmission characteristics within a desired wavelength range, e.g., as compared to the carbon nanostructure. The particular light absorption/transmission characteristics may depend upon the type of optoelectronic device in which the nanocomposites are to be used. Biomolecules which are substantially transparent to light having a wavelength within a range of wavelengths which are absorbed by the carbon nanostructure may be used. The phrase "substantially transparent" it is meant to recognize that the transparency may not be perfectly 100%. However, in this embodiment, the carbon nanostructures absorb so much more light relative to the biomolecules that the carbon nanostructures would be recognized as the light absorbing material and not the biomolecules. In other embodiments, the biomolecules may be the light absorbing material or both the biomolecules and the carbon nanostructures may be light absorbing.

Illustrative biomolecules include proteins (e.g., cytochrome c ("Cyt c")), oligonucleotides, and double-stranded DNA or RNA. Several electronic properties of Cyt c have been measured (including the electric conductivity in dark and the photoconductivity under infrared illumination), establishing that this protein behaves similarly to undoped semiconductor materials. (See, e.g., the Examples below.) Thus, biomolecules, including metalloproteins, which exhibit similar electronic properties, similar chemical structure, and/or similar physical structure as compared to Cyt c may be used. In addition, biomolecules which exhibit a resistivity similar to undoped semiconductor materials may be used (e.g., a resistivity similar to an undoped semiconductor measured at room temperature in the absence of light).

The term "cytochrome c" or "Cyt c" refers to a family of electron-transfer proteins having one or several heme c groups, bound to the protein by one or two thioether bonds involving sulphydryl groups of cysteine residues. There are four classes of Cyt c, Class I, II, III, and IV, each of which may be used. The Cyt c may be characterized from the living organism from which the Cyt c originates, e.g., horse (1HRC), fish (3CYT), or Cyt c originating from other biological organisms. Without wishing to be bound to any particular theory, it is believed that the heme group(s), a subunit consisting of a heme group and four nearby amino acids (MET-80, HIS-18, CYS-14 and CYS-18) play an important role in determining the electronic structure of Cyt c. The Fe atom in iron porphyrin is at the center of the octahedron covalently bonded with 4 planar N atoms in heme, another N atom from HIS-18 and an S atom from MET-80 at the axial sites. The presence of S in HIS-18 and also in CYS-14 and CYS-17 may play an important role in determining the initial and final states in the optical transition in the visible and near-IR region. This means synthetic proteins exhibiting a similar arrangement to these components in natural Cyt c may also be used in order to optimize optoelectronic performance.

Carbon nanostructures which may be used in the disclosed nanocomposites are composed of carbon (e.g., substantially entirely of carbon) and have at least one dimension (e.g., a width, a thickness, a diameter, etc.) of 1000 nm or less. The form of the carbon nanostructure is not particularly limited. Carbon nanostructures having a cylindrical form may be used, e.g., nanotubes, nanorods, nanofibers, nanowhiskers, etc. Illustrative cylindrical carbon nanostructures include single-walled carbon nanotubes (SWCNTs). Other cylindrical carbon nanostructure include multi-walled carbon nanotubes (MWCNTs). MWCNTs are useful as they exhibit enhanced light absorption per tube, efficient charge conduction along the tube and do not require purification. Other carbon nanostructures having spherical forms (e.g., buckyballs) or planar forms (e.g., graphene flakes) may be used. Graphene nanoribbons (i.e., unzipped carbon nanotubes) and graphene quantum dots may be used. Graphene quantum dots are graphene flakes which have a lateral dimension of less than about 10 nm. Additional carbon related nanostructures with bi-layer, multilayer and core/shell configurations comprising carbon and other functional nanostructures such as metal chalcogenides ($MoS_2$, GaSe, $WSe_2$, etc.) may also be used for the nanocomposites with additional optical and electronic tunability.

For cylindrical carbon nanostructures, the diameter of the cylindrical carbon nanostructure may be less than about 100 nm, e.g., less than about 50 nm, less than about 30 nm, less than about 10 nm, less than about 5 nm, etc. This includes embodiments in which the diameter of the cylindrical carbon nanostructure is in the range of about 1 nm to 30 nm, 10 nm to 30 nm, 1 nm to 2 nm, etc. The length of the cylindrical carbon nanostructure, while greater than the diameter, is not particularly limited. The length of the cylindrical carbon nanostructure may be in the range of from about 100 nm to about 10 μm, from about 1 μm to about 10 μm, from about 300 nm to about 5 μm, from about 300 nm to about 1 μm, etc. The term "cylindrical" is not meant to be limited to nanostructures having circular cross-sections. The cross-section may be square, rectangular, polygonal, etc.

Carbon nanostructures for the disclosed nanocomposites may be semiconducting in nature (i.e., as opposed to metallic). In the case of a composition or film comprising a plurality of nanocomposites, the carbon nanostructures in the plurality of nanocomposites may be characterized by a purity, by which it is meant the percentage of carbon nanostructures which are semiconducting. The purity may be at least 85%, at least 90%, at least 95%, etc.

The biomolecule-carbon nanocomposite may be characterized by the number of biomolecules adsorbed to the surface of the carbon nanostructure and the surface coverage of biomolecules on the surface of the carbon nanostructure. The number and surface coverage used may depend upon the type of biomolecule (e.g., its physical structure and size). The number and surface coverage used may be selected to maximize the number of covalent/non-covalent interactions between the biomolecule and the carbon nanostructure. The number and surface coverage used may be selected to prevent or minimize the bundling of carbon nanostructures in compositions or films comprising the nanocomposites. By bundling it is meant the close association of a plurality of individual carbon nanostructures (e.g., 2, 5, 10, etc.) to form a bundled, larger composite carbon nanostructure. The number of biomolecules may be in the range of from 1 to 10, 1 to 5, etc. The surface coverage of the biomolecules on the surface of the carbon nanostructure may be at least 70%, at least 80%, at least 90% or about 100%. Regardless of the particular number of biomolecules or surface coverage of biomolecules, the biomolecules may be characterized as being substantially uniformly distributed on the surface of the carbon nanostructure.

The biomolecule-carbon nanocomposites may be combined with other materials depending upon the particular application. By way of example, when the carbon nanostructure is graphene, the graphene may be layered with other materials, including other two-dimensional materials such as a monolayer of a transition metal dichalcogenide, e.g., $MoS_2$ (HOMO at about −5.8 eV, LUMO at about −4 eV); GaSe (HOMO at about −6.0 eV, LUMO at about −3.9 eV); $WSe_2$ (HOMO at about −5.1 eV, LUMO at about −3.5 eV).

A method for forming the disclosed nanocomposites may comprise preparing a first suspension of biomolecules in a solvent and preparing a second suspension of carbon nanostructures in another solvent. The solvents and concentrations of biomolecules/carbon nanostructures may be selected to ensure that the biomolecules and carbon nanostructures are well dispersed in their respective suspensions. Surfactants may be added to the suspension of carbon nanostructures to ensure the dispersion of the carbon nanostructures.

The method may further comprise mixing the first and second suspensions at a particular mass ratio of carbon nanostructures to biomolecules to form a mixture. The mass ratio may be adjusted to achieve a desired number of biomolecules or surface coverage of biomolecules per carbon nanostructure as described above and/or to prevent or minimize bundling of the carbon nanostructures in the mixture. Illustrative Cyt c:CNT mass ratios include mass ratios in the range of about 1:300, about 1:200, about 1:100, about 1:50, about 1:5, etc. Illustrative concentration ranges for carbon nanotube include from about 1 μg/mL to about 50 μg/mL and for Cyt c from about 5 μg/mL to about 20 mg/mL.

The mixture may be further sonicated for a period of time to ensure a substantially homogeneous dispersion of nanocomposites. Other illustrative details for such a method are discussed in the Examples, below.

Figure 1A:
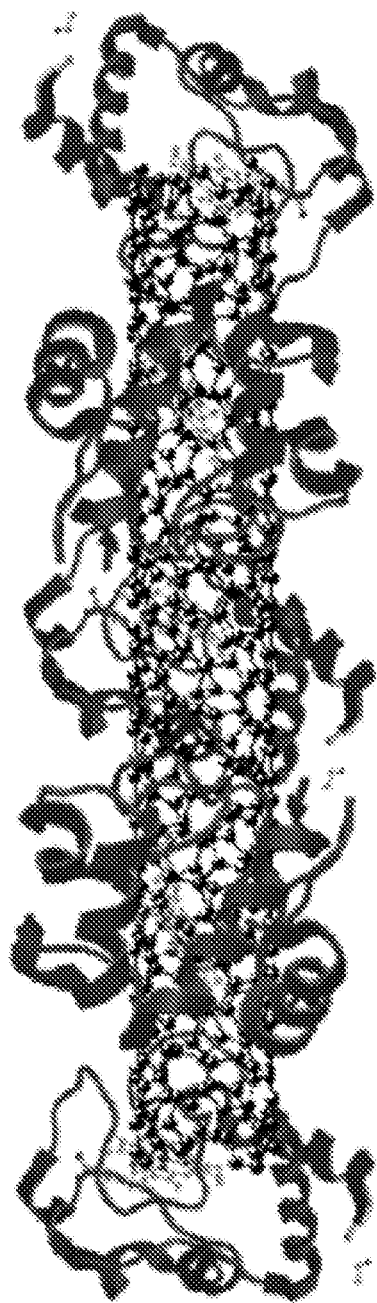
FIGS. 1A-1E illustrate a nanohybrid s-SWCNT (semiconducting single-wall carbon nanotube)/Cyt c (cytochrome c) photodetector and its operation mechanism.
Figure 1B:
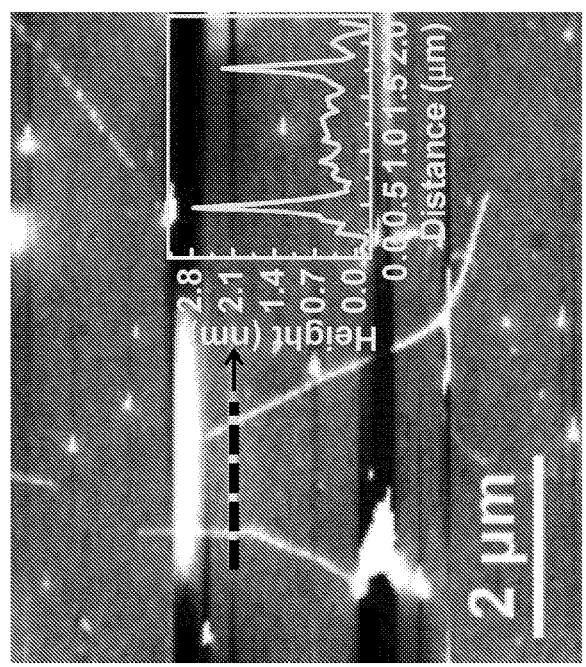
Figures 15A, 15B:
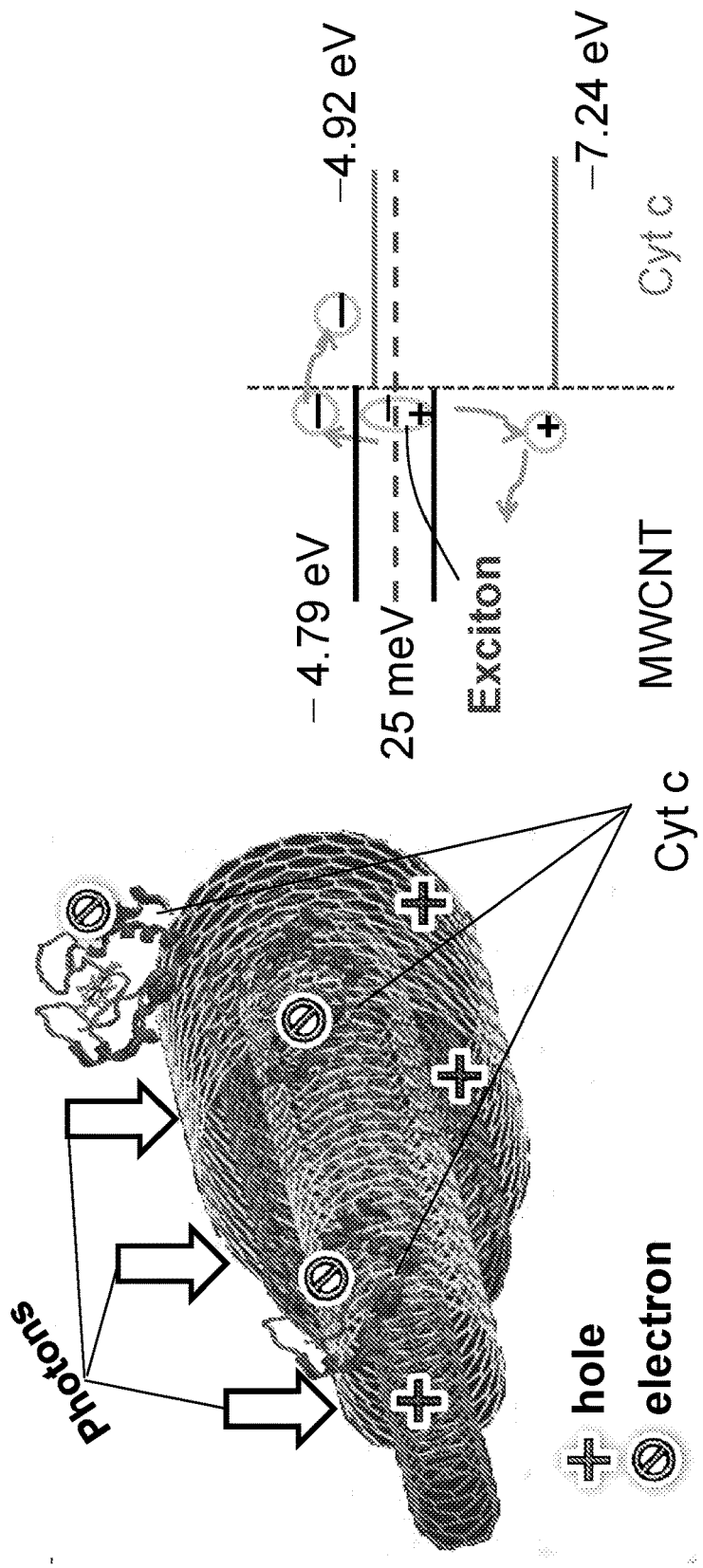
FIG. 15A shows a schematic of a MWCNT/Cyt c building block with Cyt c.
FIG. 15B shows schematic diagram of the band edge offset across the MWCNT/Cyt c interface for exciton dissociation.

An illustrative biomolecule-carbon nanocomposite (s-SWCNT/Cyt c) is shown in FIG. 1A. The band structure of the heterojunction formed at the interface of the biomolecule-carbon nanocomposite is schematically illustrated in FIG. 1D. Another illustrative biomolecule-carbon nanocomposite (MWCNT/Cyt c) is shown in FIG. 15A and the band structure of the heterojunction is schematically illustrated in FIG. 15B. Another illustrative biomolecule-carbon nanocomposite (graphene/Cyt c) is shown in FIG. 14B and the band structure of the heterojunction is schematically illustrated in FIG. 14C.

In the case of a composition or film comprising a plurality of the disclosed nanocomposites, the numeric values described above with reference to an individual nanocomposite or an individual biomolecule or an individual carbon nanostructure may refer to an average value over the population of nanocomposites.

The biomolecule-carbon nanocomposites may be used to form films for use in a variety of optoelectronic devices. The films may comprise a network of nanocomposites in which individual nanocomposites may be in contact with one or more neighboring nanocomposites such that the nanocomposites are interconnected. However, the nanocomposites may not be so closely packed in the films that they completely cover the surface of an underlying substrate. In other words, the films may be discontinuous such that portions of the surface of an underlying substrate are exposed. The nanocomposites may be substantially randomly distributed within the films. For cylindrical carbon nanostructures, the orientation of the longitudinal axes of the cylindrical carbon nanostructures with respect to a plane defined by an underlying substrate may be substantially random. The distribution of the nanocomposites within the films may be substantially uniform such that the density of nanocomposites per unit volume is substantially similar across the entire film. The films may be substantially free of bundled carbon nanostructures. The term "substantially" is used in recognition of the fact that the number of bundled carbon nanostructures may not be perfectly low, but that bundling does not occur to any significant extent. The films may be formed over a variety of underlying substrates, e.g., $SiO_2$/Si, glass, or flexible substrates, e.g., polyethylene terephthalate (PET).

The films may be characterized by the thickness of the films and the volume percent of carbon nanostructures within the films. The selected thickness may be that which provides a certain percentage of absorbed photons (e.g., at least 80%, at least 85%, at least 90%, etc.) over a particular range of wavelengths while minimizing exciton recombination within the film. Illustrative thicknesses of the disclosed films include thicknesses in the range of from about 2 nm to about 500 nm, of from about 50 nm to about 500 nm, of from about 50 nm to about 200 nm, from about 75 nm to about 125 nm, from about 150 nm to about 200 nm, etc. However, films comprising nanocomposites comprising graphene may be thinner. The selected volume percent may be that which provides a certain percentage of absorbed photons over a particular range of wavelengths while minimizing the bundling of the carbon nanostructures. Illustrative volume percents of carbon nanostructures in the disclosed films include at least about 10 vol %, at least about 15 vol %, at least about 25 vol %, at least about 50 vol %, etc. This includes a volume percent of carbon nanostructures in the range of from about 10 vol % to about 50 vol %, etc.

An illustrative method for forming the disclosed films is described in the Examples below. Other methods may be used.

In the case of a composition or film comprising a plurality of nanocomposites, the plurality of nanocomposites may include different types of nanocomposites, e.g., nanocomposites composed of different biomolecules or different carbon nanostructures or both. For example, a film may comprise a plurality of nanocomposites, the plurality of nanocomposites comprising Cyt c-SWCNT nanocomposites and Cyt c-graphene flake nanocomposites.

Figure 8:
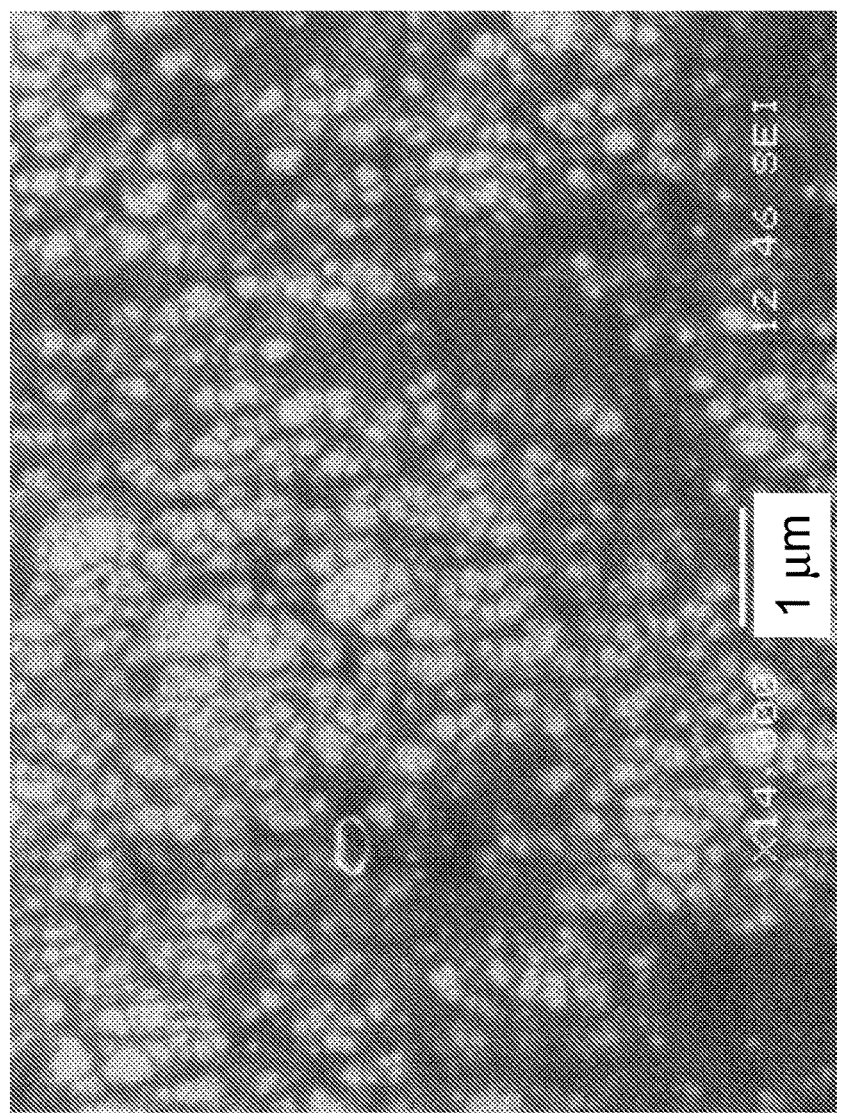
FIG. 8 shows a SEM image of an s-SWCNT/Cyt c film on SiO$_2$/Si surface.

Illustrative films comprising networks of interconnected nanocomposites are shown in FIG. 1D and FIG. 8. Another illustrative film comprising a nanocomposite comprising a sheet of graphene and Cyt c biomolecules adsorbed thereon is shown in FIG. 14B.

The disclosed biomolecule-carbon nanocomposites may be used as the light absorbing material (e.g., in the form of films comprising the nanocomposites) in a variety of optoelectronic devices. An illustrative optoelectronic device is a photonic type photodetector. By "photonic type" it is meant that the photocurrent produced by the optoelectronic device upon exposure to light is substantially generated by the dissociation of photoexcited excitons and the subsequent collection of the carriers. The term "substantially" is used in recognition of the fact that not 100% of the photocurrent may be generated by dissociated photoexcited excitons, but that such dissociation would be recognized as the primary mechanism of photocurrent generation. Photonic type photodetectors do not include and are distinguished from bolometer type photodetectors in which the photocurrent produced by the optoelectronic device upon exposure to light is substantially generated by the interaction of photoexcited excitons with the lattice of the light absorbing material to change the temperature and thus, the conductivity, of the light absorbing material. By contrast to bolometer type photodetectors, in photonic type photodetectors, current is generated upon light illumination without substantially increasing the temperature of the light absorbing material. In further contrast to bolometer type photodetectors, in photonic type photodetectors, the active layer of the photodetector (i.e., the film comprising any of the disclosed biomolecule-carbon nanocomposites) need not be thermally isolated.

A photonic type photodetector may comprise a film comprising any of the disclosed biomolecule-carbon nanocomposites, a first electrode in electrical communication with the film, a second electrode in electrical communication with the film and a device configured to measure the current collected by the electrodes when the film is exposed to light. The photodetector may include other components and be configured in various geometries typically used in photonic type photodetectors. For example, the first and second electrodes may be on the same or different sides of the film comprising the biomolecule-carbon nanocomposites. If the first and second electrodes are on the same side, various distances between the electrodes may be used, e.g., 10 nm, 100 nm, 500 nm, etc. An illustrative photonic type photodetector is shown in FIG. 1E.

Depending upon the type of biomolecules and carbon nanostructures used in the film of the photonic type photodetector, the photodetector may be used to detect light having a wavelength within different ranges of wavelengths. For example, the photodetector may be used to detect light having a wavelength within the near-infrared (e.g., from about 750 nm to about 2.5 µm), mid-infrared (e.g., from about 2.5 µm to about 10 µm), or long-infrared (e.g., from about 10 µm to about 1 mm), portion of the electromagnetic spectrum. The photodetector may also be used to detect light having a wavelength within the UV (e.g., from about 100 nm to about 400 nm) or visible (e.g., from about 400 nm to about 700 nm) portion of the electromagnetic spectrum. For example, both Cyt c and SWCNT may be used as the light absorbing component in Cyt c-SWCNT nanocomposites for light in the UV and visible portions of the electromagnetic spectrum.

The disclosed photonic type photodetectors may be characterized by a variety of properties, including photoresponsivity $R_i$ and external quantum efficiency (EQE). Both $R_i$ and EQE depend on how much photon absorption the active element has, which is typically proportional to the thickness of the element before saturation of absorption (100% absorption). Values of $R_i$ and EQE may be determined using the equations and measurement techniques described in the Examples below. The disclosed biomolecule-carbon nanocomposites may be capable of providing photonic type photodetectors having very high values of $R_i$ and EQE. In some embodiments, the photonic type photodetector is characterized by a $R_i$ of at least 0.1 $AW^{-1}$ at a light intensity of 15 mW/cm$^2$, a bias voltage of about 14 V and a wavelength in the range of from about 1 to 1.3 µm. This includes embodiments in which the $R_i$ under these conditions is at least 0.5 $AW^{-1}$, at least 1 $AW^{-1}$, at least 10 $AW^{-1}$, at least 100 $AW^{-1}$, etc. Even higher values of $R_i$ may be obtained at lower light intensity values. In some embodiments, the photonic type photodetector is characterized by an EQE of at least 50% at a light intensity of 15 mW/cm$^2$, a bias voltage of about 14 V, a sample length of about 300 µm and a wavelength in the range of from about 1 to 1.3 µm. This includes embodiments in which the EQE under these conditions is at least 75%, at least 80%, at least 85%, at least 90%, etc. However, photonic type photodetectors exhibiting values of $R_t$ and EQE outside these ranges may be used.

As discussed in the Examples, below, the disclosed photonic type photodetectors may be characterized by their noise characteristics and detectivity D*. Both may be determined using the equations and measurement techniques described in the Examples below. The disclosed biomolecule-carbon nanocomposites may be capable of providing photonic type photodetectors having very low levels of noise and very high values of D*. In some embodiments, the photonic type photodetector is characterized by a D* of at least $10^7$ cmHz$^{1/2}$ W$^{-1}$ at a light intensity of 15 mW/cm$^2$ and a bias voltage of about 6 V. This includes embodiments in which the D* under these conditions is at least $10^8$, $10^9$, $10^{10}$, $10^{11}$, etc. These values may refer to a wavelength in the range of from about 1 to 1.3 µm. These values may refer to a temperature which is about room temperature (i.e., uncooled). However, photonic type photodetectors exhibiting values of D* outside these ranges may be used.

A method of using any of the disclosed photonic type photodetectors may comprise exposing the film comprising the biomolecule-carbon nanocomposites to light and measuring current collected at the electrodes. When the light comprises a wavelength sufficient to generate excitons in the film (e.g., in the carbon nanostructure), the excitons will dissociate at the heterojunction in the nanocomposites and the free carriers will be subsequently collected at the electrodes in electrical communication with the film (e.g., electrons via the biomolecule and holes via the carbon nanostructure).

The photonic type photodetectors comprising the disclosed nanocomposites are useful in a variety of diverse applications, e.g., missile detection.

The disclosed biomolecule-carbon nanocomposites and films comprising the same are also useful in other optoelectronic devices. An optoelectronic device may comprise a film comprising any of the disclosed biomolecule-carbon nanocomposites, a first electrode in electrical communication with the film and a second electrode in electrical communication with the film. For example, Cyt c may be used as the solar light absorbing component in a photovoltaic cell comprising a film of Cyt c-carbon nanostructure nanocomposites. Depending upon the type of optoelectronic device, the device may include other components and be configured in various geometries typically used for such devices. The optoelectronic device may be a photovoltaic cell which generates electricity upon exposure to light, e.g., solar radiation. As with the photonic type photodetectors, when light generates excitons in the film of the photovoltaic cell, the excitons will dissociate at the heterojunction in the nanocomposites and the free carriers will be subsequently collected at the electrodes in electrical communication with the film.

Another optoelectronic device is a field effect (photo) transistor. A schematic of a graphene field effect transistor (GFET) is illustrated in FIGS. 14A-14C. The GFET may include a substrate (e.g., SiO$_2$/Si), a source electrode mounted on the substrate, a drain electrode in electrical communication with the source electrode, a gate electrode in electrical communication with the source electrode, and a Cyt c-graphene nanocomposite (e.g., a layer of graphene having Cyt c proteins adsorbed on the layer of graphene) forming a conductive channel between the source and drain electrodes.

EXAMPLES

Example 1: Cytochrome c and Single-Wall Carbon Nanotube: Engineered Nanohybrid Building Blocks for Infrared Detection at High Quantum Efficiency Biomolecule cytochrome c (Cyt c), a small molecule of a chain of amino acids with extraordinary electron transport, was helically wrapped around a semiconductive single-wall carbon nanotube (s-SWCNT) to form a molecular building block for uncooled infrared detection with two uniquely designed functionalities: exciton dissociation to free charge carriers at the heterojunction formed on the s-SWCNT/Cyt c interface and charge transport along the electron conducting chain of Cyt c (acceptor) and hole conducting channel through s-SWCNT (donor). Using these building blocks, uncooled s-SWCNT/Cyt c thin film infrared detectors were synthesized and shown to have extraordinary photoresponsivity up to 0.77 A due to a high external quantum efficiency (EQE) in exceeding 90%, which represents a more than two orders of magnitude enhancement than the best previously reported on CNT-based infrared detectors with EQE of only 1.72%. (See, Lu, R. T., Christianson, C., Kirkeminde, A., Ren, S. Q. & Wu, J. Extraordinary photocurrent harvesting at type-II heterojunction interfaces: Toward high detectivity carbon nanotube infrared detectors. *Nano Lett.* 12, 6244-6249 (2012).)

Methods

Fabrication of the s-SWCNT/Cyt c Films Photodetector.

Firstly, the suspensions of Cyt c and s-SWCNT were prepared separately. The Cyt c (purity ≥95%) from equine heart was directly dissolved in deionized (DI) water to form a solution of 2 mg/ml. The s-SWCNTs (purity of semiconducting SWCNTs ~95% with diameters ranging from 1.2 to 1.7 nm and a length distribution from 300 nm to 5 µm) with surfactant triton were also dissolved in DI water to form a SWCNTs suspension with concentration of ~5 µg/ml. The two suspensions were mixed at 1:40 (SWCNTs: Cyt c) mass ratio and the mixture was kept in an ice-water bath and sonicated (Branson1800) for 3 h. After sonication, the samples were centrifuged to remove insoluble material. For s-SWCNT/Cyt c film fabrication, 0.2 micron mixed cellulose ester (MCE) filter membranes were employed in a vacuum filtration apparatus. Care was taken in transferring the s-SWCNT/Cyt c solution into the filter funnel to avoid bubbles on the solution surface. Bursting surfactant bubbles disrupted the film continuity when it was wet and fragile. The thickness of the formed films was 150-200 nm. Two Au (40 nm)/Ti (4 nm) electrodes with spacing of 0.3-0.40 mm were pre-deposited onto the SiO$_2$/Si substrates using electron-beam evaporation through a shadow mask. s-SWCNT/Cyt c film with 0.3 mm width is transferred onto the substrate with the pre-deposited Au/Ti electrodes followed with dissolving the filtration membrane. The pure Cyt c film devices (channel width and length were 2 mm and 0.35 mm, respectively) were fabricated on the same substrate with the same electrodes as a control sample by using a prepared solution of 2 mg/ml.

Photoresponse Measurements.

All measurements were carried out at room temperature and under atmospheric conditions. To measure the photocurrent in accordance with the voltage source mode, the measured circuit was set up that the device was connected in series with a constant resistor. Bias voltage was applied in the circuit using an Agilent E3631A voltage source, and the electric current was determined using a HP 34420A voltmeter. The illumination was provided by an xenon light with a NIR filter for the passing band of 1.0-1.3 µm. The incident light power density was calibrated using a Thorlabs PM100D thermal power meter. Dynamic photoresponse at various modulation frequencies controlled by a mechanical chopper was measured using an Agilent 54624A oscilloscope. The noise spectra at various bias voltages were obtained using a Stanford Research SR760 spectrum analyzer and an Agilent E3631A voltage source.

FIG. 1A depicts schematically an s-SWCNT/Cyt c nanohybrid building block with a Cyt c molecule wrapping around an s-SWCNT via self-assembly in solution prior to film formation. Atomic force microscopy (AFM) was applied to characterize the morphology of the s-SWCNT/Cyt c building blocks dispersed on $SiO_2$/Si substrates. FIG. 1B shows a representative AFM image of several s-SWCNT/Cyt c building blocks with the length in the range of 0.3-5.0 µm and the diameter, of 2.2 to 3.0 nm. The diameter of the s-SWCNT/Cyt c hybrid building block is larger than that of the original s-SWCNTs in the range of 1.2-1.7 nm. Considering the Cyt c is a small molecule, primarily a chain of amino acids of small diameter typically on the order of 1 nm or less, the measured diameter of the s-SWCNT/Cyt c hybrid building block is consistent with Cyt c adsorbing to and wrapping around the individual s-SWCNTs. The small diameter of the s-SWCNT/Cyt c hybrid building blocks allows much higher SWCNTs concentration in the s-SWCNT/Cyt c thin films. At the 150-200 nm film thickness selected for this example, the effective SWCNTs thickness could be up to 80-110 nm, which is close to the optimal SWCNTs thickness for an almost complete NIR absorption. Film morphology was analyzed using scanning electron microscopy (SEM). An SEM image of one film is shown in FIG. 8.

Figure 1C:
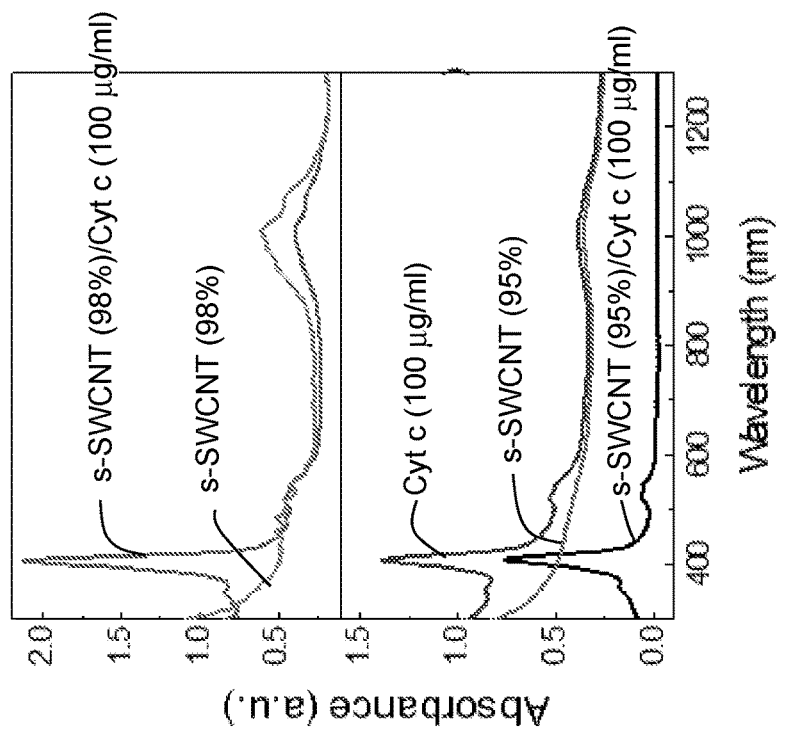
Figure 1D:
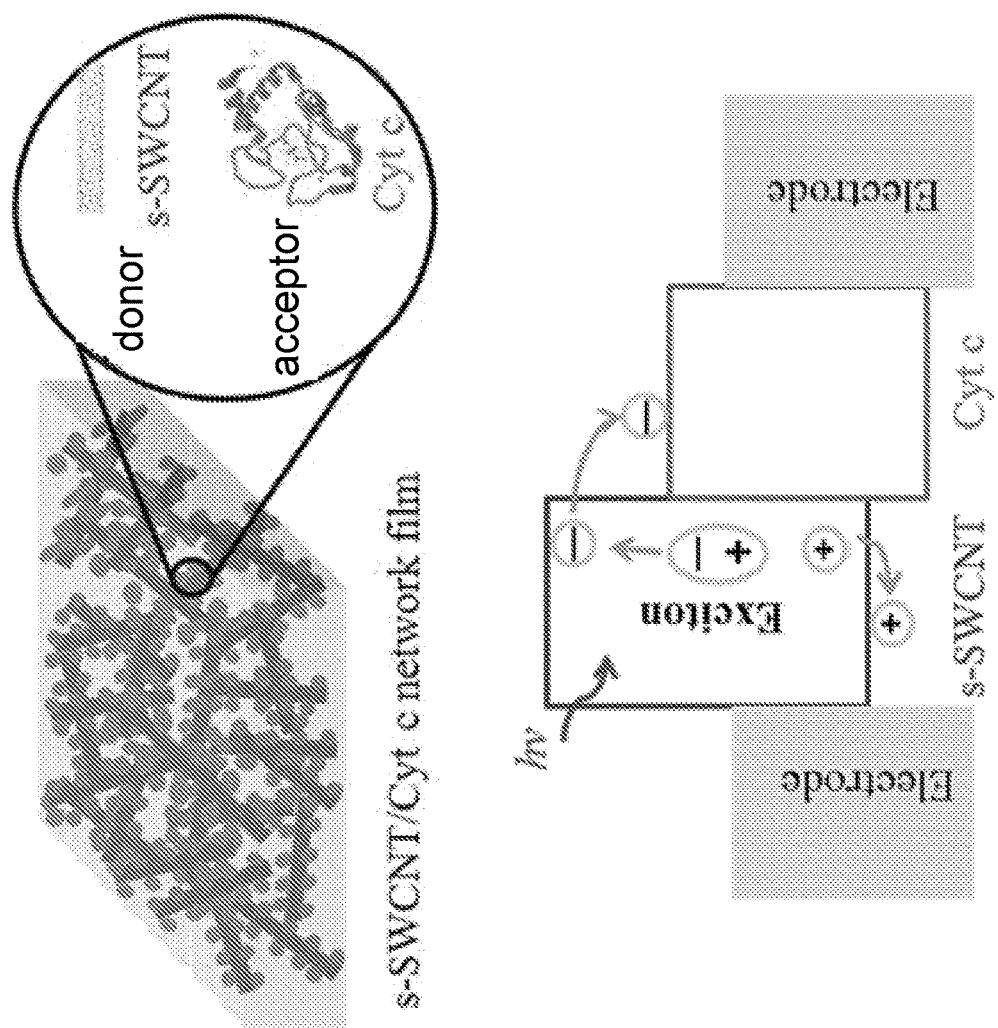
Figure 1E:
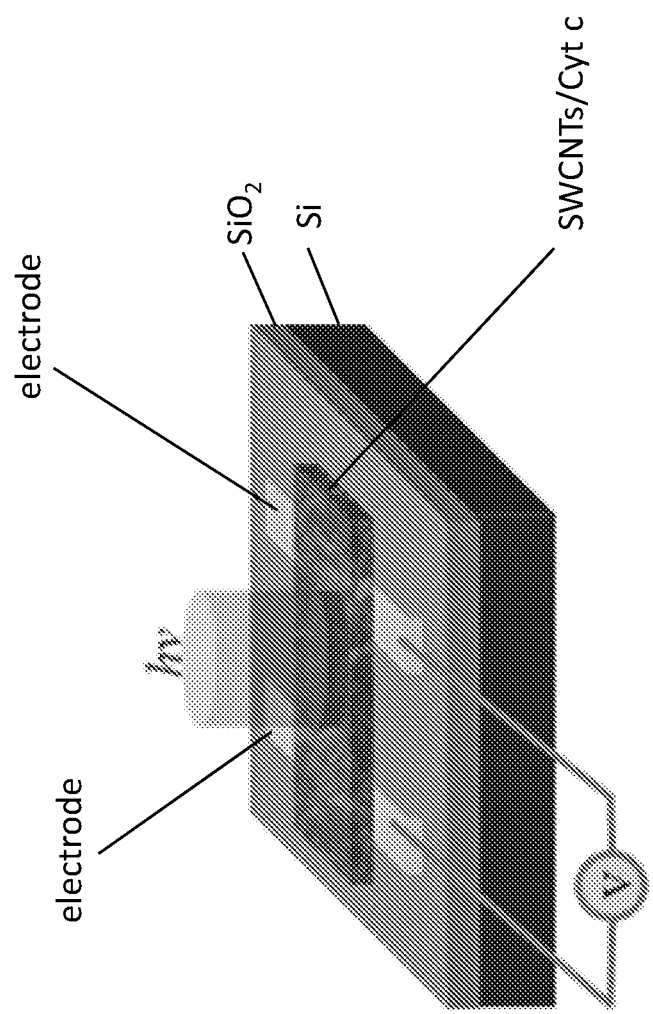

FIG. 1C compares the optical absorbance spectra of the pure Cyt c and the s-SWCNT/Cyt c nanohybrid suspensions measured using a Cary 5000 ultraviolet-visible-NIR dual-beam spectrophotometer. The s-SWCNT/Cyt c nanohybrid presents a much stronger absorption than its pure Cyt c counterpart in the entire wavelength range from UV to NIR. In particular, the pure Cyt c is almost transparent at above ~600 nm wavelength. This means the s-SWCNTs will dominantly contribute to the NIR absorption and photoexcitation under NIR illumination. The results using s-SWCNT having 98% purity are also shown. As depicted in FIG. 1D and from SEM images (not shown), the s-SWCNT/Cyt c nanohybrid film can be viewed as a composite or network of well dispersed s-SWCNT/Cyt c building blocks, in each of them a heterojunction is formed across the s-SWCNT/Cyt c interface with SWCNT and Cyt c serving, respectively, as electron donor and acceptor according to their band edge alignment. These heterojunctions play a critical role in exciton dissociation into free charge carriers upon NIR photon absorption by s-SWCNTs. The s-SWCNT/Cyt c nanohybrid composite, also allows a high concentration of the light absorber (SWCNT in this case) achievable through selection of small pairing molecules such as Cyt c. Furthermore, the highly efficient electron (or hole) transport properties of the biomolecules are essential to facilitate charge transport through the composite with minimal charge recombination. In this regards, Cyt c is an excellent choice for s-SWCNT to form efficient electron/hole transport in the s-SWCNT/Cyt c nanohybrid with s-SWCNT and Cyt c serving as hole and electron transport channels respectively. FIG. 1E shows schematically the s-SWCNT/Cyt c nanohybrid device employed in this example for characterization of NIR detection. When light impinges onto the photodetector, excitons are generated in the s-SWCNTs and dissociated at the s-SWCNT/Cyt c heterojunctions into free carriers, resulting in enhanced photoconductivity as the photoresponse.

Figure 2A:
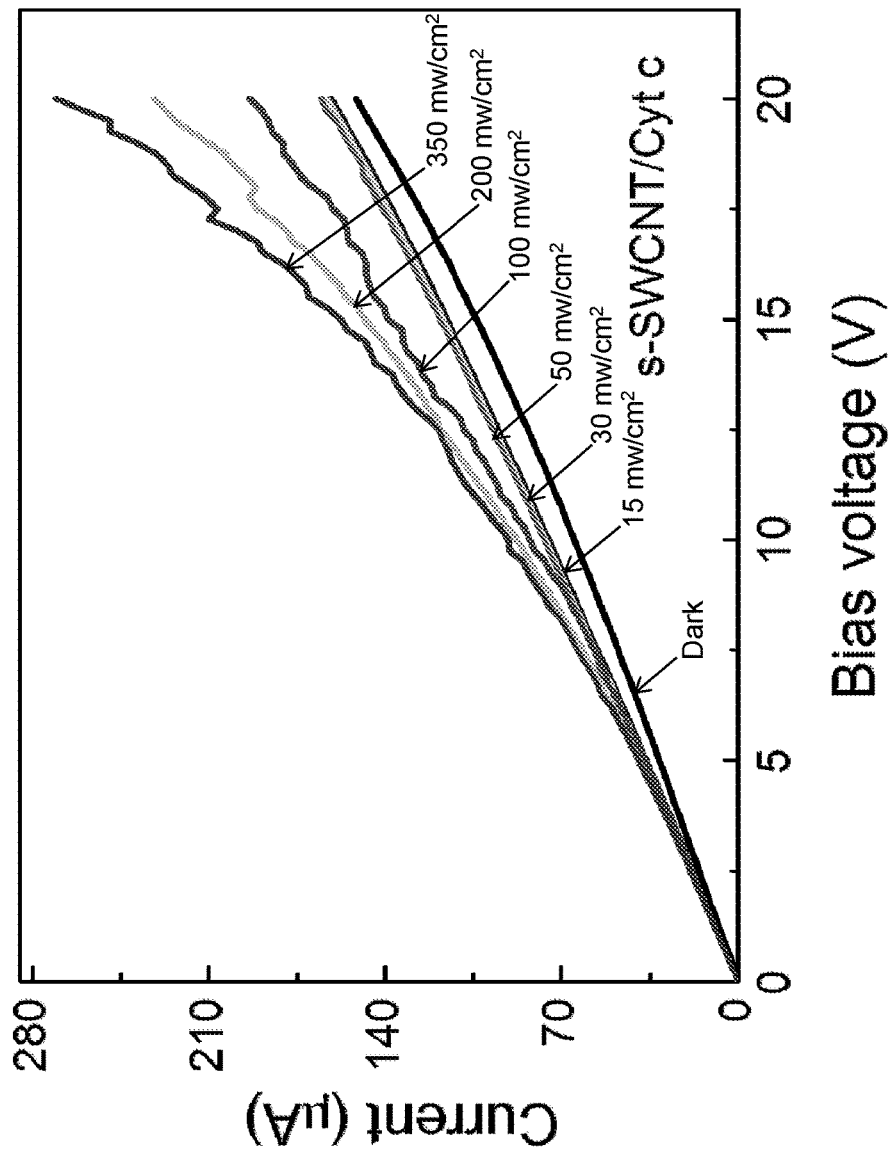
FIGS. 2A-2D illustrate the photoresponse and external quantum efficiency of the s-SWCNT/Cyt c nanohybrid.

FIG. 2A illustrates the V-I characteristic measured on a representative s-SWCNT/Cyt c photodetector in response to NIR illumination with various incident power density ranging from 15 to 350 mW/cm². Accordingly, the effective incident NIR power ($P_{in}$) can be calculated by the NIR power density multiplying by the irradiated sample area. A strong photoresponse is clearly demonstrated. In particular, the V-I curves are highly nonlinear in a similar way to the s-SWCNT/P3HT nanohybrid case. (See, Lu, R. T., Christianson, C., Kirkeminde, A., Ren, S. Q. & Wu, J. Extraordinary photocurrent harvesting at type-II heterojunction interfaces: Toward high detectivity carbon nanotube infrared detectors. *Nano Lett.* 12, 6244-6249 (2012).) This nonlinear V-I characteristic differs fundamentally from the linear one reported in CNT-based bolometers due to the heterojunctions implemented for exciton dissociation to photocurrent, instead of heat. (See, Lu, R. T., Shi, J. J., Baca, F. J. & Wu, J. Z. High performance multiwall carbon nanotube bolometers. *J. Appl. Phys.* 108, 084305 (2010) and Lu, R. T., Li, Z. Z., Xu, G. W. & Wu, J. Z. Suspending single-wall carbon nanotube thin film infrared bolometers on microchannels. *Appl. Phys. Lett.* 94, 163110 (2009).) In order to quantify the photoresponse, photoresponsivity $R_i$ defined as photocurrent-to-incident NIR power ratio ($I_{photo}/P_{in}$) is calculated and compared in FIG. 2B with respect to different NIR intensities. Two different types of behaviors are shown. At low NIR light intensity before 100 mW/cm², the $R_i$ increases with the bias voltage initially, followed with a reversed trend after its saturation at a peak $R_i$ value located in the bias voltage range of 14-16V. The peak $R_i$ values are 0.77, 0.41 and 0.28 A $W^{-1}$ at NIR light intensities of 15, 30, and 50 mW/cm², respectively. These high $R_i$ values observed on the s-SWCNT/Cyt c photodetectors are more than two orders of magnitude higher than that of their s-SWCNT/P3HT counterparts and represents the best so far achieved on the CNT-based IR detectors. (See, Lu, R. T., Shi, J. J., Baca, F. J. & Wu, J. Z. High performance multiwall carbon nanotube bolometers. *J. Appl. Phys.* 108, 084305 (2010); Lu, R. T., Li, Z. Z., Xu, G. W. & Wu, J. Z. Suspending single-wall carbon nanotube thin film infrared bolometers on microchannels. *Appl. Phys. Lett.* 94, 163110 (2009); Lu, R. T., Christianson, C., Kirkeminde, A., Ren, S. Q. & Wu, J. Extraordinary photocurrent harvesting at type-II heterojunction interfaces: Toward high detectivity carbon nanotube infrared detectors. *Nano Lett.* 12, 6244-6249 (2012); Pradhan, B., Kohlmeyer, R. R., Setyowati, K., Owen, H. A. & Chen, J. Advanced carbon nanotube/polymer composite infrared sensors. *Carbon* 47, 1686-1692 (2009); Bang, D. et al. Effectively enhanced sensitivity of a polyaniline-carbon nanotube composite thin film bolometric near-infrared sensor. *J. Mater. Chem.* 22, 3215-3219 (2012); Pradhan, B., Setyowati, K., Liu, H. Y., Waldeck, D. H. & Chen, J. Carbon nanotube-polymer nanocomposite infrared sensor. *Nano Lett.* 8, 1142-1146 (2008) and Glamazda, A. Y., Karachevtsev, V. A., Euler, W. B. & Levitsky, I. A. Achieving high mid-IR bolometric responsivity for anisotropic composite materials from carbon nanotubes and polymers. *Adv. Funct. Mater.* 22, 2177-2186 (2012).) Moreover, the high $R_i$ obtained in the s-SWCNT/Cyt c photodetectors is comparable to and slightly better than the recent reports on waveguide-integrated graphene NIR photodetectors. (See, Pospischil, A. et al. CMOS-compatible graphene photodetector covering all optical communication bands. *Nature Photon.* 7, 892-896 (2013); Wang, X. M., Cheng, Z. Z., Xu, K., Tsang H. K. &

Figure 2B:
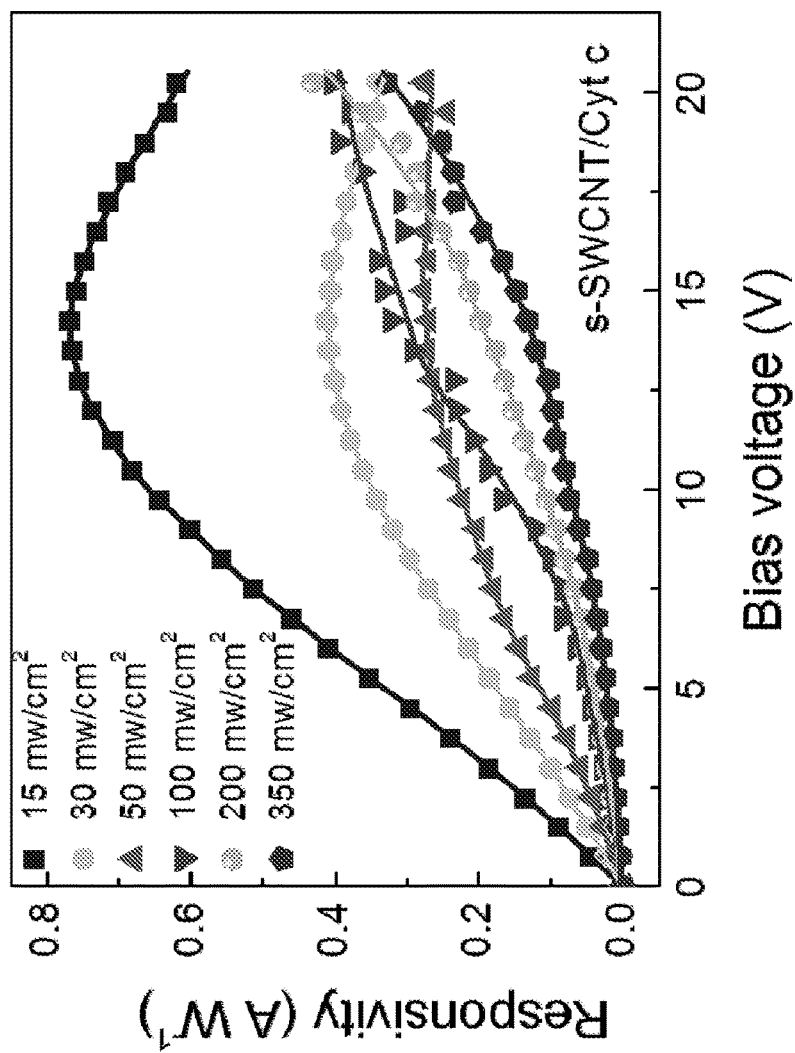
Figure 2C:
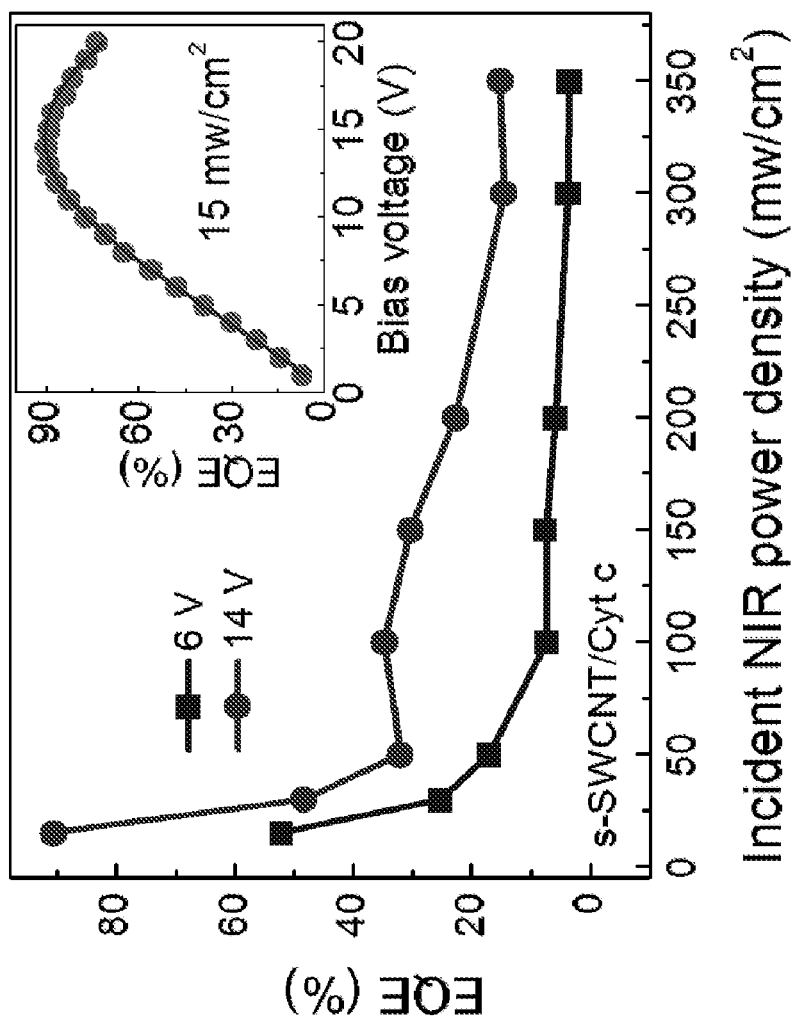

Xu, J. B. High-responsivity graphene/silicon-heterostructure waveguide photodetectors. *Nature Photon.* 7, 888-891 (2013) and Gan, X. T. et al. Chip-integrated ultrafast graphene photodetector with high responsivity. *Nature Photon.* 7, 883-887 (2013).) This enhancement may be attributed to the dramatically improved EQE defined as the ratio of the number of the photo-generated charges to the number of incident photons: $EQE=hvI_{photo}/eP_{in}=hvR_i/e$, where h is the Planck's constant, v is the optical frequency and e is the electron charge. As shown in FIG. 2C, the EQE is up to 90.5% in the case of the s-SWCNT/Cyt c nanohybrids in contrast to only 1.72% in their s-SWCNT/P3HT counterparts primarily due to the much higher SWCNT concentration by more than an order of magnitude as compared to the s-SWCNT/P3HT counterparts. In addition, improved charge transport through the Cyt c molecular chains, as compared to charge hoping in bulk P3HT with extremely short diffusion length for holes (P3HT is a hole acceptor in the s-SWCNT/P3HT nanohybrid), may add on further contributions to the enhanced EQE and $R_i$ in the s-SWCNT/Cyt c NIR detectors.

The trend of monotonic decreasing $R_i$ values with increasing NIR power intensity at a given bias voltage in the range of 0-20 V, correlates well with the trend of decreasing EQE with increasing NIR light intensity shown in FIG. 2C. At higher NIR light intensities, the $R_i$ peak disappears as a consequence of monotonic increase of the $R_i$ with increasing bias voltage. The overall $R_i$ as well as EQE at higher NIR intensities are considerably lower than that in the lower intensity range. The EQE also depends on the bias voltage at a given incident NIR power intensity and the highest EQE was observed at around 14 V bias voltage under NIR power intensity of 15 mW/cm² (inset of FIG. 2C).

Figure 5A:
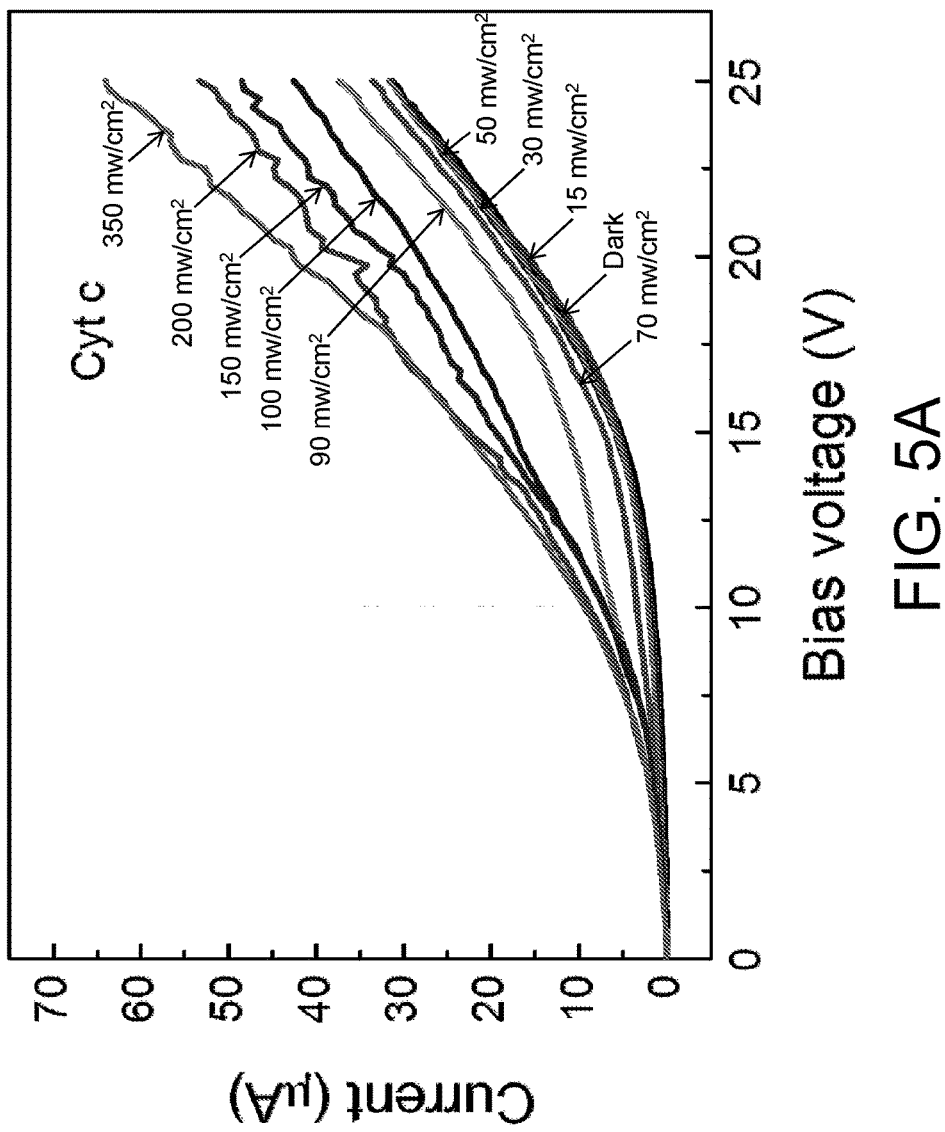
FIG. 5A shows I-V curves of the pure Cyt film devices under dark and NIR illumination of various incident power density from 15 to 350 mW/cm$^2$.
Figure 5B:
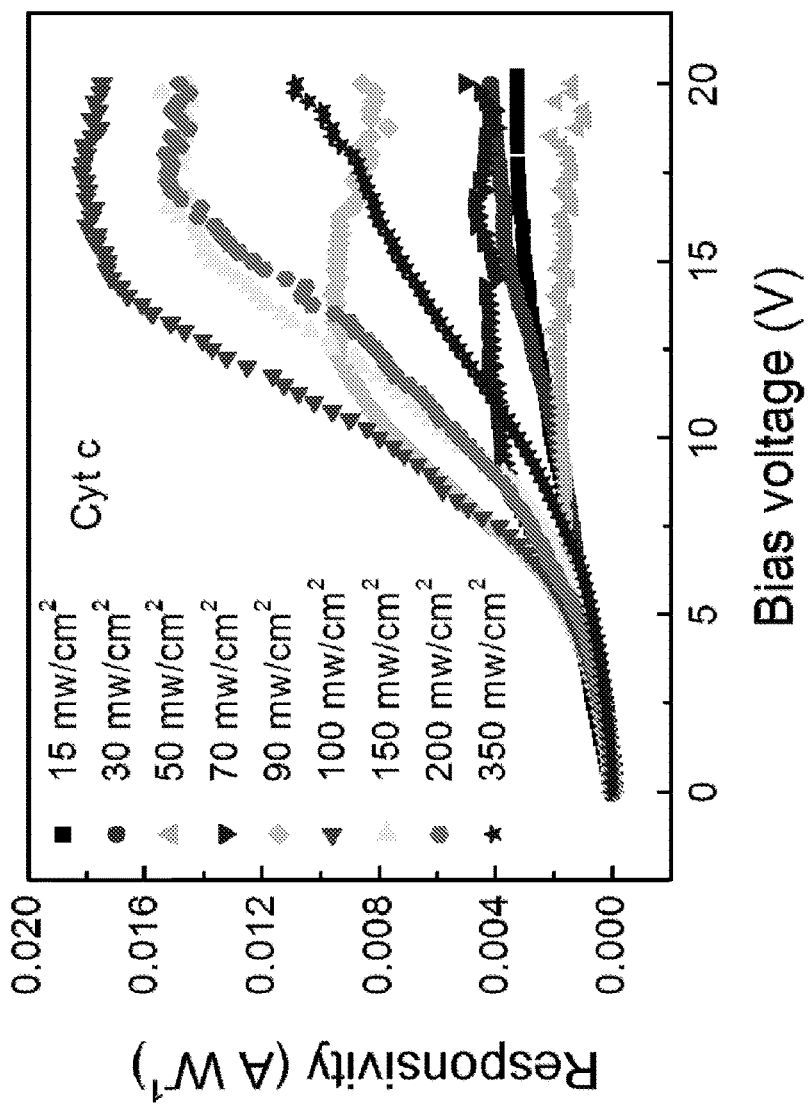
FIG. 5B shows the bias voltage dependence of the photoresponsivity of the pure Cyt c film devices at various incident NIR power density from 15 to 350 mW/cm$^2$.
Figure 5C:
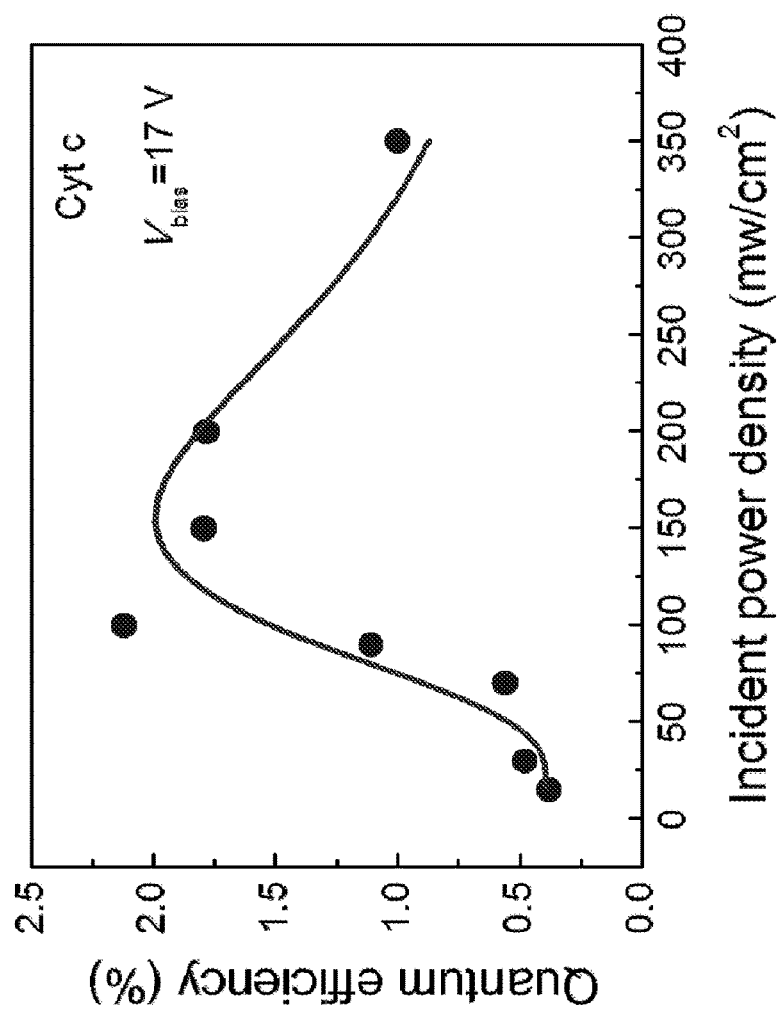
FIG. 5C plots the EQE of the pure Cyt c film device as a function of incident NIR power density.

To shed some light on the contribution of the Cyt c in the measured photoresponse in the s-SWCNT/Cyt c devices, the same measurement as detailed in FIGS. 2A-2D on the s-SWCNT/Cyt c devices was repeated on pure Cyt c devices of a similar geometry. Several fundamental differences have been observed between the pure Cyt c (FIGS. 5A-C) and s-SWCNT/Cyt c hybrid devices (FIGS. 2A-2D). First, the photoresponse in the former is significantly smaller than that in the latter by at least one order of magnitude depending on the NIR light intensity. On the other hand, the NIR power intensity dependence of the $R_i$ is qualitatively different in these two types of devices. Specifically, the $R_i$ of the pure Cyt c device is negligibly small at low NIR light intensity below 50 mW/cm² illumination power intensity (FIGS. 5A and 5B), in contrast to the higher $R_i$ values at lower NIR power intensity in the s-SWCNT/Cyt c hybrid devices. This results in significantly different EQE vs. NIR power intensity curves in these two types of devices as shown in FIGS. 2C and 5C, suggesting different mechanisms responsible for the NIR photoresponse in these two cases. Although bolometric effect was reported in Cyt c photodetectors previously, a significant contribution of such a bolometric effect from pure Cyt c to the NIR photoresponse in s-SWCNT/Cyt c hybrid NIR detectors is unlikely considering the $R_i$ as high as 0.77 A W$^{-1}$ at NIR power intensity of 15 mW/cm² in the hybrid devices is at least two orders of magnitude larger than that of the pure Cyt c control devices. Furthermore, the EQE in the Cyt c control devices is very low and the maximum observed value is ~2.2% (FIG. 5C). These results therefore confirm that the efficient exciton dissociation into photocurrent at the s-SWCNT/Cyt c heterojunctions and the efficient charge transport along the Cyt c chains are the key to high photoresponsivity in the s-SWCNT/Cyt c hybrid NIR detectors.

Figure 2D:
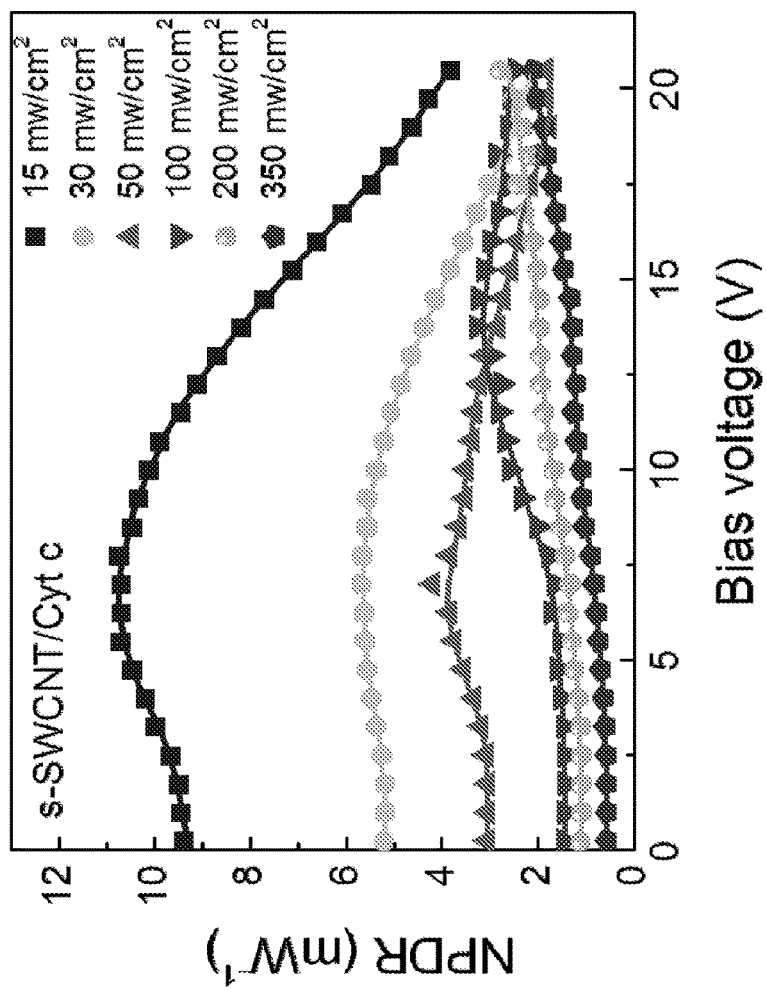

To gain further insights in the performance of the photodetectors, the ratio of photocurrent to dark current ($I_{photo}/I_{dark}$) was calculated. Since the incident NIR power $P_{in}$ have a considerable effect on the $I_{photo}$, the normalized photocurrent-to-dark current ratio defined as $NPDR=(I_{photo}/I_{dark})/P_{in}=R_i/I_{dark}$ was used as a more objective parameter to eliminate effect of the $P_{in}$. The NPDR vs. bias voltage curves of the s-SWCNT/Cyt photodetector at different incident NIR power intensity is depicted in FIG. 2D. A general trend of higher NPDR at lower NIR power intensity can be clearly seen, which suggests a larger specific portion of the dark current generation at higher NIR intensity due to most probably of the heating by incident light. Nevertheless, it is remarkable that NPDR value as high as ~10.8 mW$^{-1}$ can be achieved on the s-SWCNT/Cyt c photodetectors, which represents an improvement of approximately two orders of magnitude with respect to the case of the s-SWCNT/P3HT nanohybrid NIR detectors. (See, Lu, R. T., Christianson, C., Kirkeminde, A., Ren, S. Q. & Wu, J. Extraordinary photocurrent harvesting at type-II heterojunction interfaces: Toward high detectivity carbon nanotube infrared detectors. *Nano Lett.* 12, 6244-6249 (2012).) In fact, this performance is on par with the reported value of 10 mW$^{-1}$ on the waveguide-integrated graphene IR detectors. (See, Wang, X. M., Cheng, Z. Z., Xu, K., Tsang H. K. & Xu, J. B. High-responsivity graphene/silicon-heterostructure waveguide photodetectors. *Nature Photon.* 7, 888-891 (2013).)

Figure 3A:
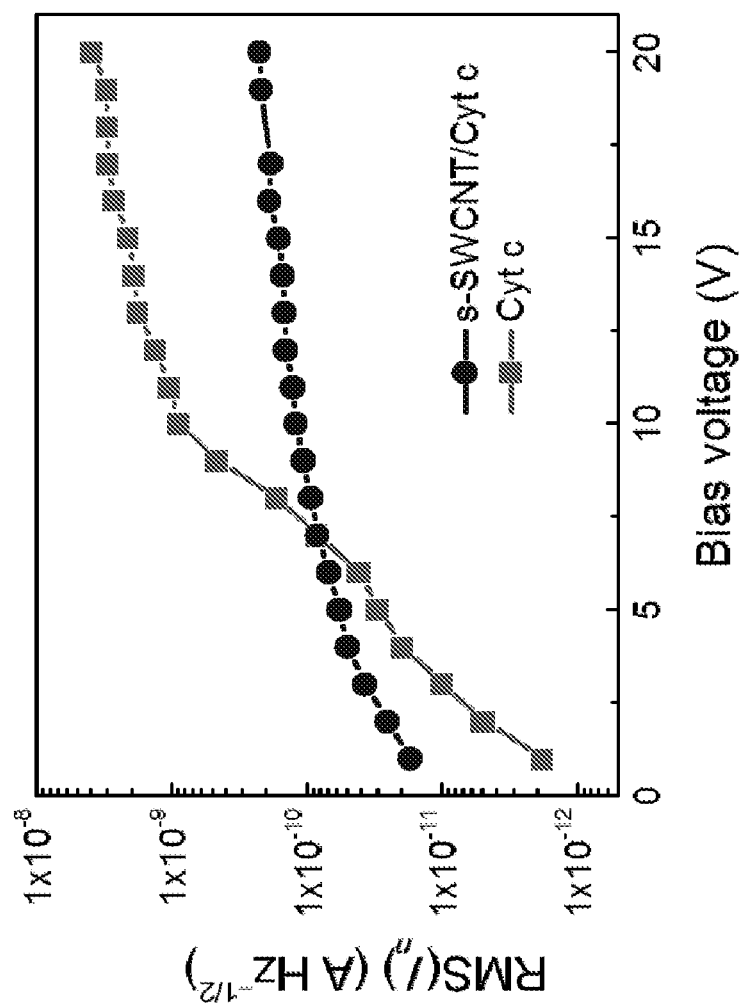
FIGS. 3A-3C illustrate the noise and detectivity of the s-SWCNT/Cyt c nanohybrid.
Figure 6:
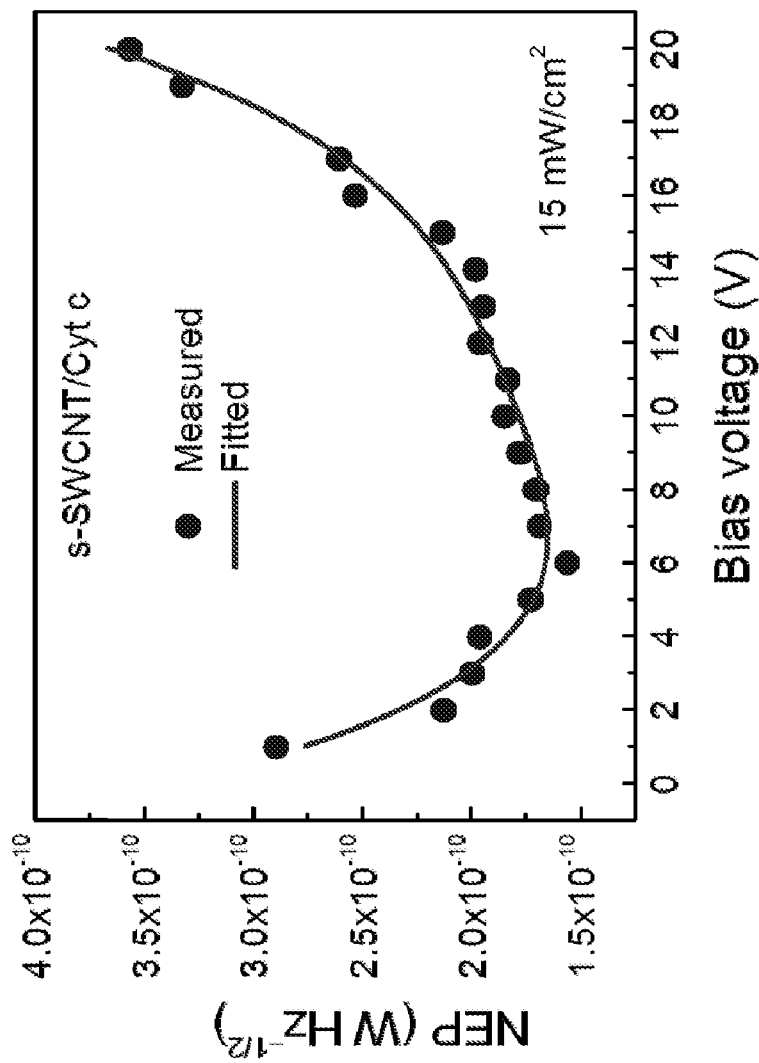
FIG. 6 plots the noise equivalent power (NEP) as function of the bias voltage taken on the s-SWCNT/Cyt c devices.
Figure 7:
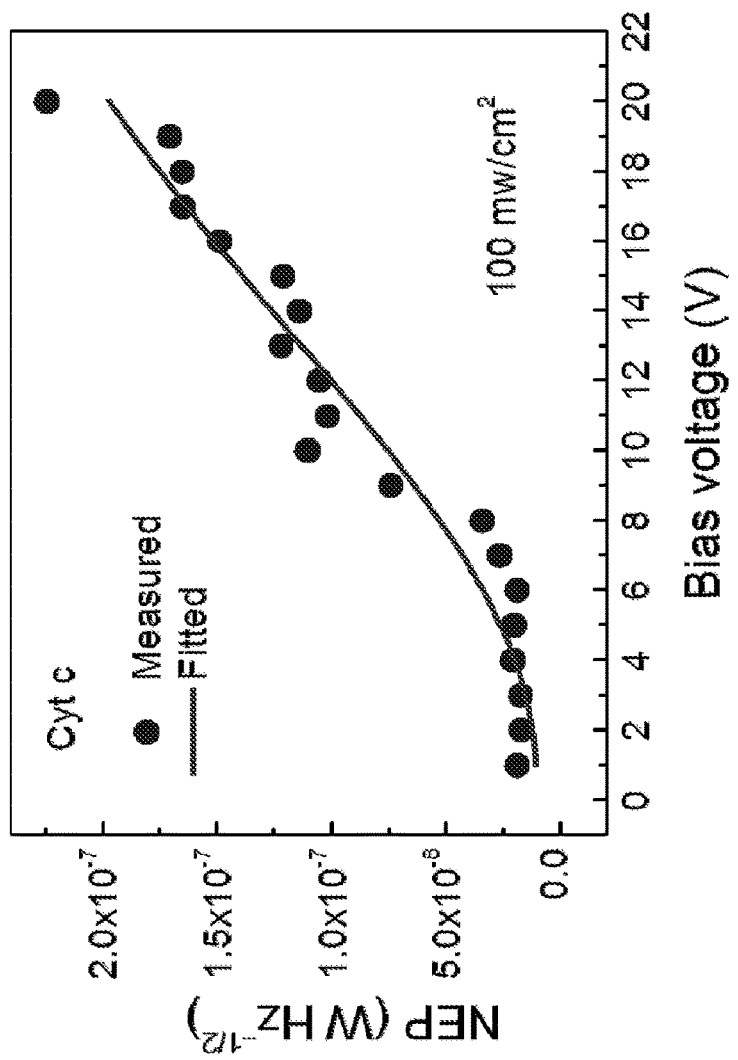
FIG. 7 plots NEP versus bias voltage of the pure Cyt c devices.

An important parameter related to the sensitivity of a photodetector is the noise equivalent power (NEP), which represents the incident light power required for the detector output signal to be equal to the noise current, typically expressed with units of W Hz$^{-1/2}$. NEP is defined by $NEP=\overline{i_n^2}^{1/2}/R_i$ where the $\overline{i_n^2}$ is the mean square noise current calculated from the spectra density of noise power of s-SWCNT/Cyt c device. Spectra of current noise power density of s-SWCNT/Cyt c nanohybrid in the double logarithmic coordinates were obtained (data not shown). Spectra of current noise power density of the pure Cyt c device in the double logarithmic coordinates were also obtained (data not shown). The $\overline{i_n^2}$ of the s-SWCNT/Cyt c and the pure Cyt c devices monotonically decreases with increasing frequency, which can be fitted by $\overline{i_n^2} \propto 1/f$ in the low frequency range up to few kHz, indicating that 1/f noise dominates the current noise behavior in at low frequencies. FIG. 3A reveals a monotonic, linear bias voltage dependence of root mean square noise current $RMS(I_n)$, $\overline{i_n^2}^{1/2}$ of the s-SWCNT/Cyt c nanohybrid devices and its magnitude spans across the range of 1.7×10$^{-11}$-2.2×10$^{-10}$ AHz$^{-1/2}$ in the bias voltage range of 1-20 V (circle). This compares well with the reported noise characteristic in CNTs and suggest the CNTs dominate the noise spectra in the s-SWCNT/Cyt c nanohybrids. (See, Pradhan, B., Kohlmeyer, R. R., Setyowati, K., Owen, H. A. & Chen, J. Advanced carbon nanotube/polymer composite infrared sensors. *Carbon* 47, 1686-1692 (2009); Bang, D. et al. Effectively enhanced sensitivity of a polyaniline-carbon nanotube composite thin film bolometric near-infrared sensor. *J. Mater. Chem.* 22, 3215-3219 (2012); Pradhan, B., Setyowati, K., Liu, H. Y., Waldeck, D. H. & Chen, J. Carbon nanotube-polymer nanocomposite infrared sensor. *Nano Lett.* 8, 1142-1146 (2008) and Glamazda, A. Y., Karachevtsev, V. A., Euler, W. B. & Levitsky, I. A. Achieving high mid-IR bolometric responsivity for anisotropic composite materials from carbon nanotubes and polymers. *Adv. Funct. Mater.* 22, 2177-2186 (2012).) The calculated NEP was plotted against the bias voltage. The minimum NEP value of ~$1.5 \times 10^{-10}$ W Hz$^{-1/2}$ was observed at ~6 V bias under 15 mw/cm$^2$ (FIG. 6). While the NEP increases with either increasing or decreasing bias voltage at higher or lower bias voltages. Interestingly, the NEP of the pure Cyt c control device presents an exponential increase with increasing bias and is ~three orders of magnitude larger than that of the s-SWCNT/Cyt c device (FIG. 7).

Figure 3B:
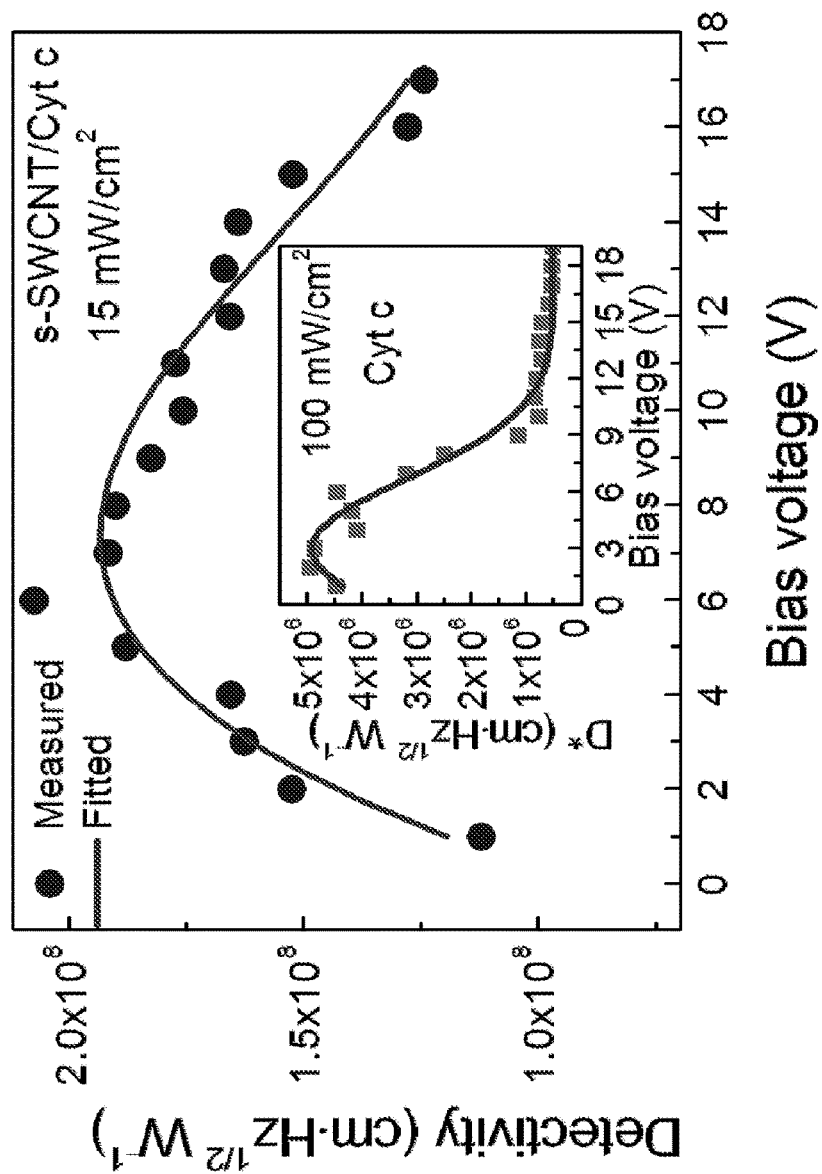
Figure 3C:
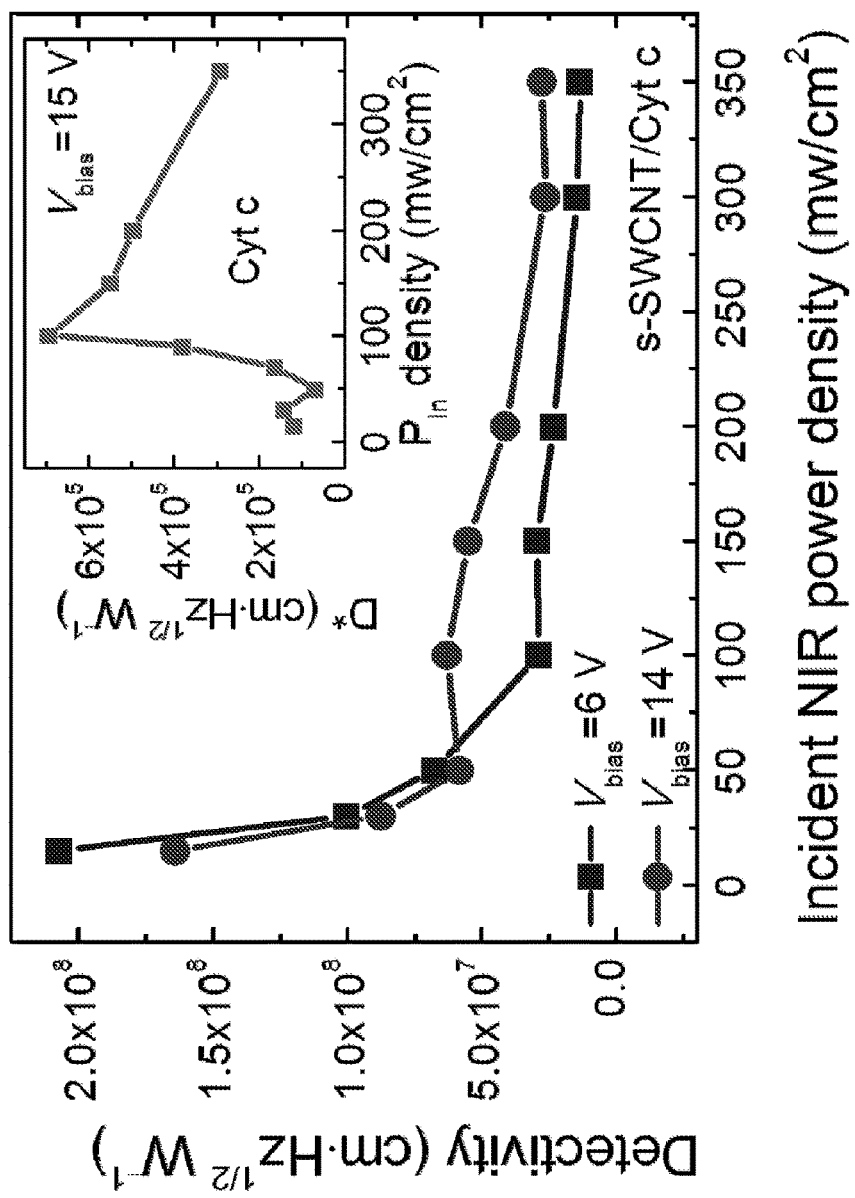

The differences in NEP lead to different figure-of-merit detectivity D* that is independent of the device area in characterizing photodetector's performance, in these two types of the devices. The D* can be calculated by D*= $(A)^{1/2}$/NEP=$R_i(A)^{1/2}/\overline{i_n^2}^{1/2}$, where A is the detection area with unit of cm$^2$. On the s-SWCNT/Cyt c hybrid device, the best D* is as high as ~$2 \times 10^8$ cm Hz$^{1/2}$W$^{-1}$ at the bias voltage of ~6 V under 15 mW/cm$^2$, and the trend in D* vs. bias voltage curve (FIG. 3B) correlates well with the bias dependence of $R_i$ and $\overline{i_n^2}^{1/2}$ (FIGS. 2B and 3A). While this is comparable to the best D* values reported for uncooled CNT-based IR detectors, higher D* could be projected at lower NIR power intensity. (See, Lu, R. T., Christianson, C., Kirkeminde, A., Ren, S. Q. & Wu, J. Extraordinary photocurrent harvesting at type-II heterojunction interfaces: Toward high detectivity carbon nanotube infrared detectors. *Nano Lett.* 12, 6244-6249 (2012).) In contrast, the D* of the pure Cyt c control device is about two orders of magnitude lower (inset in FIG. 3B), which is consistent with its lower responsivity and higher noise (FIGS. 5B and 7). FIGS. 3B and 3C show the D* of s-SWCNT/Cyt c and the pure Cyt c devices, respectively, as functions of incident NIR power density. It is noted that the D* of s-SWCNT/Cyt c monotonically decreased with increasing incident NIR power, which implies these devices have an advantage of high sensitivity in low energy photon detection. This is essentially different from the pure Cyt c whose D* shows a parabola law and appears a peak at 100 mW/cm$^2$ due to their different NIR photoresponse mechanisms, which is consistent with the dependence of the EQE versus light intensity.

Figure 4A:
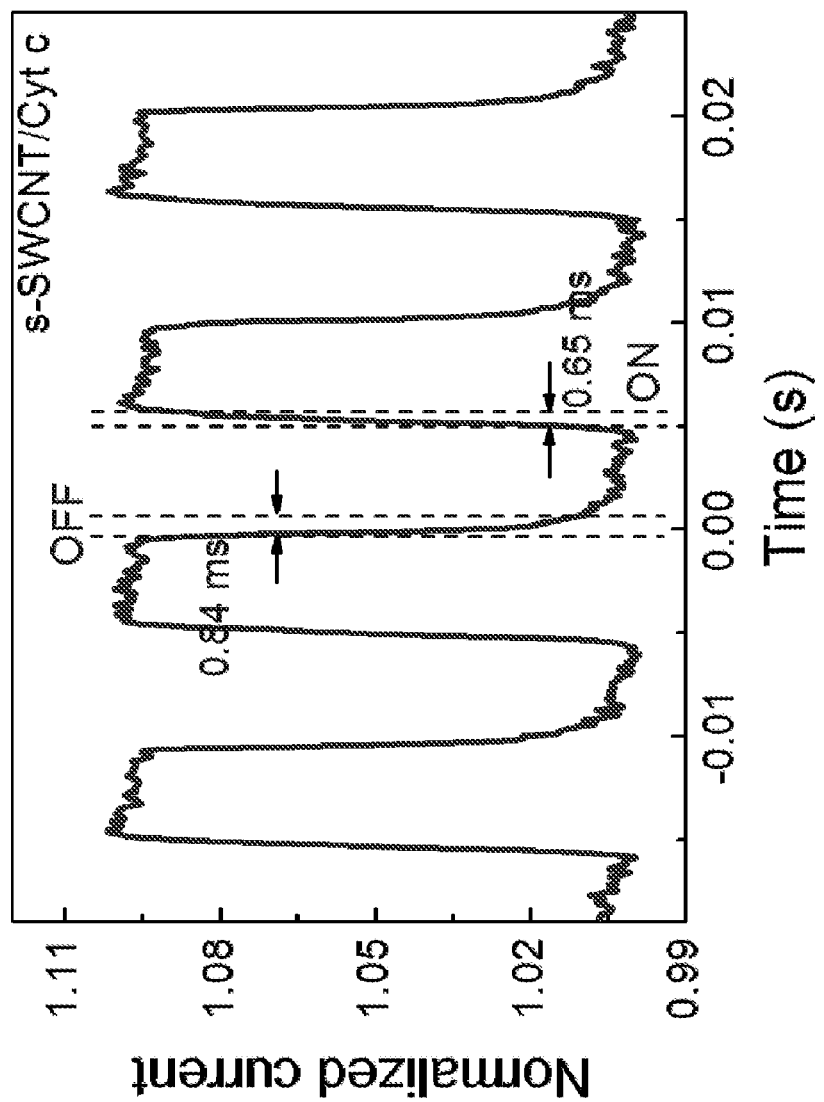
FIG. 4A shows a representative dynamic photoresponse measured on the s-SWCNT/Cyt c nanohybrid.
Figure 4B:
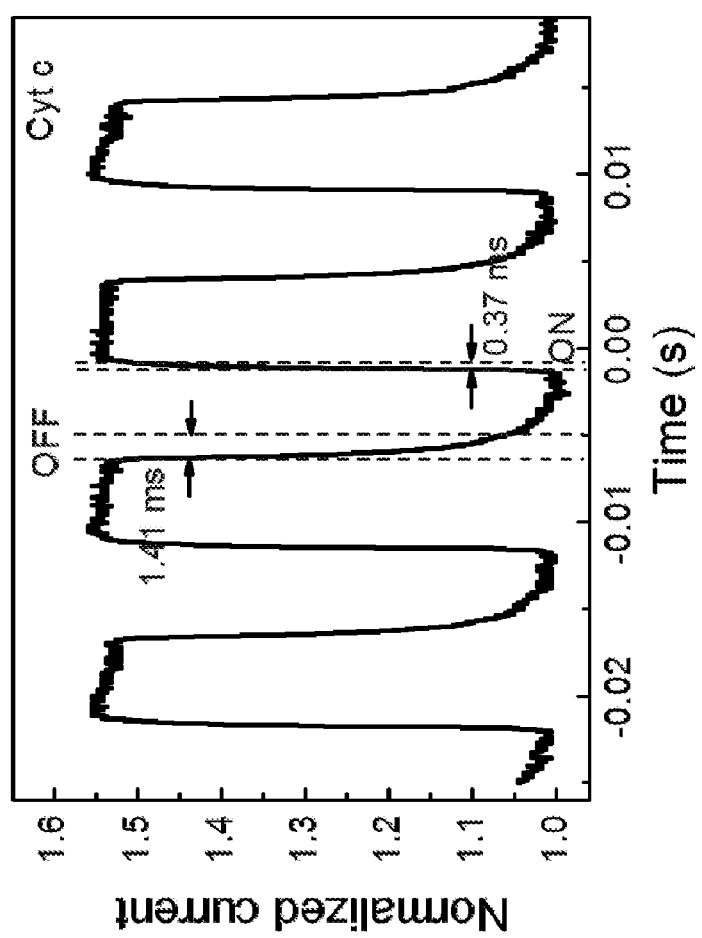
FIG. 4B shows a representative dynamic photoresponse measured on the pure Cyt c devices at NIR modulation frequency of 97 Hz.

FIGS. 4A and 4B compare the dynamic photoresponse of the s-SWCNT/Cyt c and the pure Cyt c devices, respectively, at 97 Hz NIR modulation frequency. The response times of the s-SWCNT/Cyt c nanohybrid device for light on and off are 0.65 ms and 0.84 ms, respectively, which are calculated from 10% to 90% maximum photocurrent. It is worth noting that the photoresponse of the s-SWCNT/Cyt c device is considerably faster than that of the pure SWCNT devices, or in general the CNT-based IR bolometers. (See, Lu, R. T., Shi, J. J., Baca, F. J. & Wu, J. Z. High performance multiwall carbon nanotube bolometers. *J. Appl. Phys.* 108, 084305 (2010); Lu, R. T., Li, Z. Z., Xu, G. W. & Wu, J. Z. Suspending single-wall carbon nanotube thin film infrared bolometers on microchannels. *Appl. Phys. Lett.* 94, 163110 (2009); Lu, R. T., Christianson, C., Kirkeminde, A., Ren, S. Q. & Wu, J. Extraordinary photocurrent harvesting at type-II heterojunction interfaces: Toward high detectivity carbon nanotube infrared detectors. *Nano Lett.* 12, 6244-6249 (2012); Pradhan, B., Kohlmeyer, R. R., Setyowati, K., Owen, H. A. & Chen, J. Advanced carbon nanotube/polymer composite infrared sensors. *Carbon* 47, 1686-1692 (2009); Bang, D. et al. Effectively enhanced sensitivity of a polyaniline-carbon nanotube composite thin film bolometric near-infrared sensor. *J. Mater. Chem.* 22, 3215-3219 (2012); Pradhan, B., Setyowati, K., Liu, H. Y., Waldeck, D. H. & Chen, J. Carbon nanotube-polymer nanocomposite infrared sensor. *Nano Lett.* 8, 1142-1146 (2008) and Glamazda, A. Y., Karachevtsev, V. A., Euler, W. B. & Levitsky, I. A. Achieving high mid-IR bolometric responsivity for anisotropic composite materials from carbon nanotubes and polymers. *Adv. Funct. Mater.* 22, 2177-2186 (2012).) While the observed response times are comparable to that on s-SWCNT/P3HT nanohybrid NIR detectors, some remarkable differences exist. In particular, the time constant of 0.84 ms corresponding to the light off in the s-SWCNT/Cyt c devices is considerably shorter than the 1.4 ms of s-SWCNT/P3HT nanohybrid NIR detectors. Considering the two types of detectors have a similar light-on time constant in the range of 0.6-0.65 ms, the temporal responses to NIR light on and off are much more symmetric in the s-SWCNT/Cyt c devices as compared to their s-SWCNT/P3HT counterparts. This symmetry means not only better photodetector performance, but also the reduced charge trapping effect in the former. Without wishing to be bound to any particular theory, it is hypothesized that the slower charger transport in Cyt c as opposed to the faster one in SWCNT in the s-SWCNT/Cyt c nanohybrids bottlenecks the response time. This argument is supported by the comparable light-on and light-off time constants observed in the pure Cyt c control devices illustrated in FIG. 4B. If a similar argument would be applied to the case of s-SWCNT/P3HT nanohybrids, the improved light-off response time in the s-SWCNT/Cyt c nanohybrids may be attributed to the considerably better charge transport medium of Cyt c than P3HT.

A novel s-SWCNT/Cyt c nanohybrid for uncooled infrared detection has been developed. The demonstrated higher photoresponsivity by more than two orders of magnitude than the best reported on CNT-based IR detectors due to the high EQE in exceeding 90% illustrates the importance and feasibility of material design at molecular level in nanohybrids. This nanohybrid approach is attractive for high-performance and low-cost optoelectronic applications because it allows: 1) molecular-scale design of material building blocks that can have light-solid interactive properties superior to conventional materials, 2) large-scale device fabrication with compatibility to existing microfabrication procedures, and 3) on-chip integration with Si-based readout circuits.

Example 2: Flexible Ultra-Broadband Photodetectors with High Detectivity Based on Carbon Nanotube Adsorbed Protein Nanohybrid Methods Fabrication of the s-SWCNT/Cyt c Films Photodetector.

Firstly, the suspensions of Cyt c and s-SWCNT were prepared separately. The Cyt c (purity ≥95%) from equine heart was directly dissolved in deionized (DI) water to form a solution of 2 mg/ml. The s-SWCNTs (purity of semiconducting SWCNTs ~95% with diameters ranging from 1.2 to 1.7 nm and a length distribution from 300 nm to 5 μm) with surfactant triton were also dissolved in DI water to form a SWCNTs suspension with concentration of 5 μg/ml. The two suspensions were mixed at 1:40 (SWCNTs: Cyt c) mass ratio and the mixture was kept in an ice-water bath and sonicated (Branson1800) for 3 h. After sonication, the samples were centrifuged to remove insoluble material. For s-SWCNT/Cyt c film fabrication, 0.2 micron mixed cellulose ester (MCE) filter membranes were employed in a vacuum filtration apparatus. Care was taken in transferring the s-SWCNT/Cyt c solution into the filter funnel to avoid bubbles on the solution surface. Bursting surfactant bubbles disrupted the film continuity when it was wet and fragile. The thickness of the formed films was ~150 nm, which is close to the optimal SWCNTs thickness (80-110 nm) for an almost complete light absorption. Two Au (40 nm)/Ti (4 nm)

electrodes with spacing of 0.3-0.4 mm were pre-deposited onto the flexible PET substrates using electron-beam evaporation through a shadow mask. s-SWCNT/Cyt c film with 0.2-0.4 mm width was transferred onto the substrate with the pre-deposited Au/Ti electrodes followed with dissolving the filtration membrane. A single-layer graphene was grown on commercial copper foils with 25 μm thickness (Alfa Aesar, item No. 13382) at ~1000° C. by chemical vapor deposition method. Here briefly, a Cu foil was first heated to 1000° C., following the mixed gas containing 35 sccm $CH_4$ and 2 sccm $H_2$ was flowed to Cu foil surface for the graphene growth for 30 min under a total pressure of 500 mTorr. The graphene was transferred to Si substrate with 90 nm $SiO_2$ by polymethyl methacrylate (PMMA) assistant wet etching in iron chloride solution (0.1 g $mL^{-1}$). The back-gate GFET was fabricated by a conventional two-step lithography technology.

Photoresponse Measurements.

All measurements were carried out at room temperature and under atmospheric conditions. To measure the photocurrent in accordance with the voltage source mode, the measured circuit was set up that the device was connected in series with a constant resistor. Bias voltage was applied in the circuit using an Agilent E3631A voltage source, and the electric current was determined using a HP 34420A voltmeter. The illumination was provided by a 75-W xenon light with a 0.125-m gating monochromator (Newport Cornerstone 130 ⅛ m monochromator). The incident light power was monitored by Newport 70310 multifunction optical power meter and a UV-enhanced silicon photodiode. The light density illuminated on the devices surface depends on the wavelength range (300-1,000 nm) and spot diameter. Dynamic photoresponse at various modulation frequencies controlled by a mechanical chopper was measured using an Agilent 54624A oscilloscope. The noise spectra at various bias voltages were obtained using a Stanford Research SR760 spectrum analyzer and an Agilent E3631A voltage source.

Results and Discussion

Figure 9:
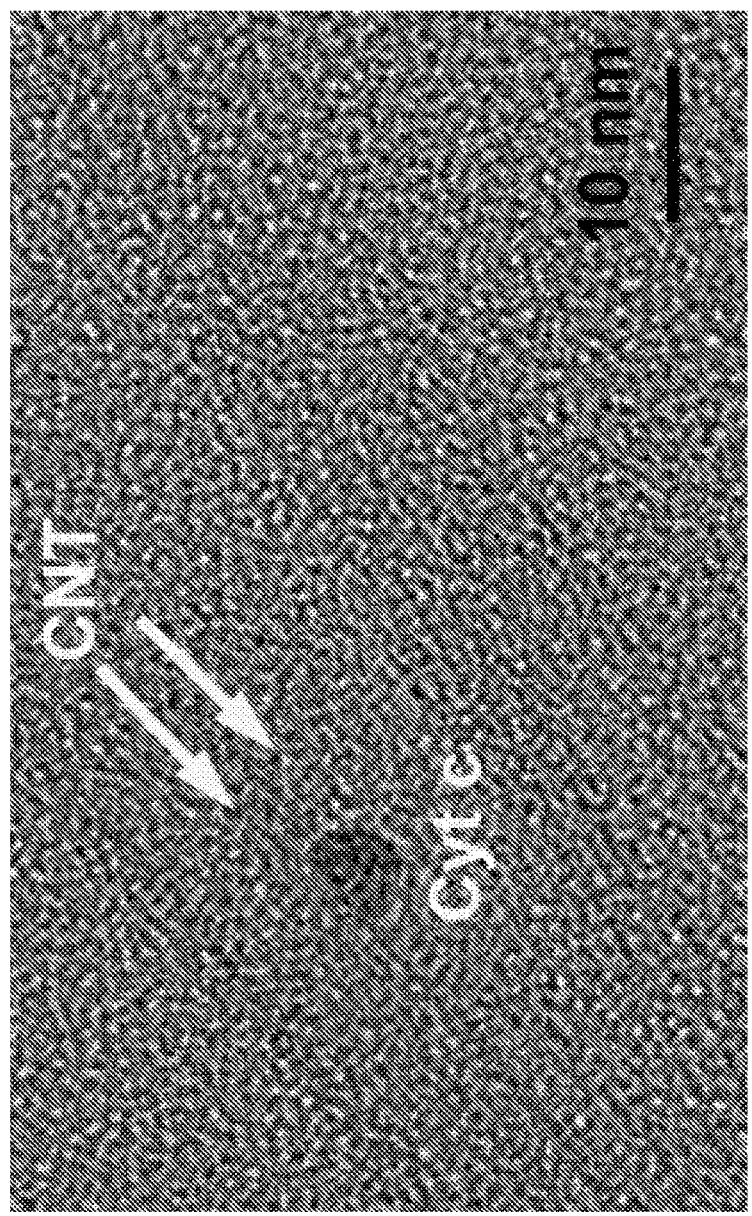
FIG. 9 shows a high-resolution transmission electron microscope (HRTEM) image of a Cyt c adsorbed on the surface of a SWCNT.

As described in Methods, s-SWCNT/Cyt c nanohybrid building blocks were formed. The absorption of Cyt c on the individual s-SWCNTs was confirmed by high-resolution electron microscope (HRTEM). An HRTEM image showing the absorption of Cyt c on a s-SWCNT is shown in FIG. 9. The s-SWCNT/Cyt c nanohybrid film can be viewed as a composite or network of well dispersed s-SWCNT/Cyt c building blocks, in each of them a heterojunction is formed across the s-SWCNT/Cyt c interface with SWCNT and Cyt c serving, respectively, as electron donor and acceptor according to their band edge alignment. These heterojunctions play an important role in exciton dissociation into free charge carriers upon NIR photon absorption by s-SWCNTs. The s-SWCNT/Cyt c nanohybrid composite, however, has a unique advantage in terms of much higher concentration of the light absorber (SWCNT in this case) achievable through selection of small pairing molecules such as Cyt c. Furthermore, the highly efficient electron (or hole) transport properties of the biomolecules facilitate charge transport through the composite with minimal charge recombination. In this regards, Cyt c is an excellent choice for s-SWCNT to form efficient electron/hole transport in the s-SWCNT/Cyt c nanohybrid with s-SWCNT and Cyt c serving as hole and electron transport channels respectively.

Figure 10:
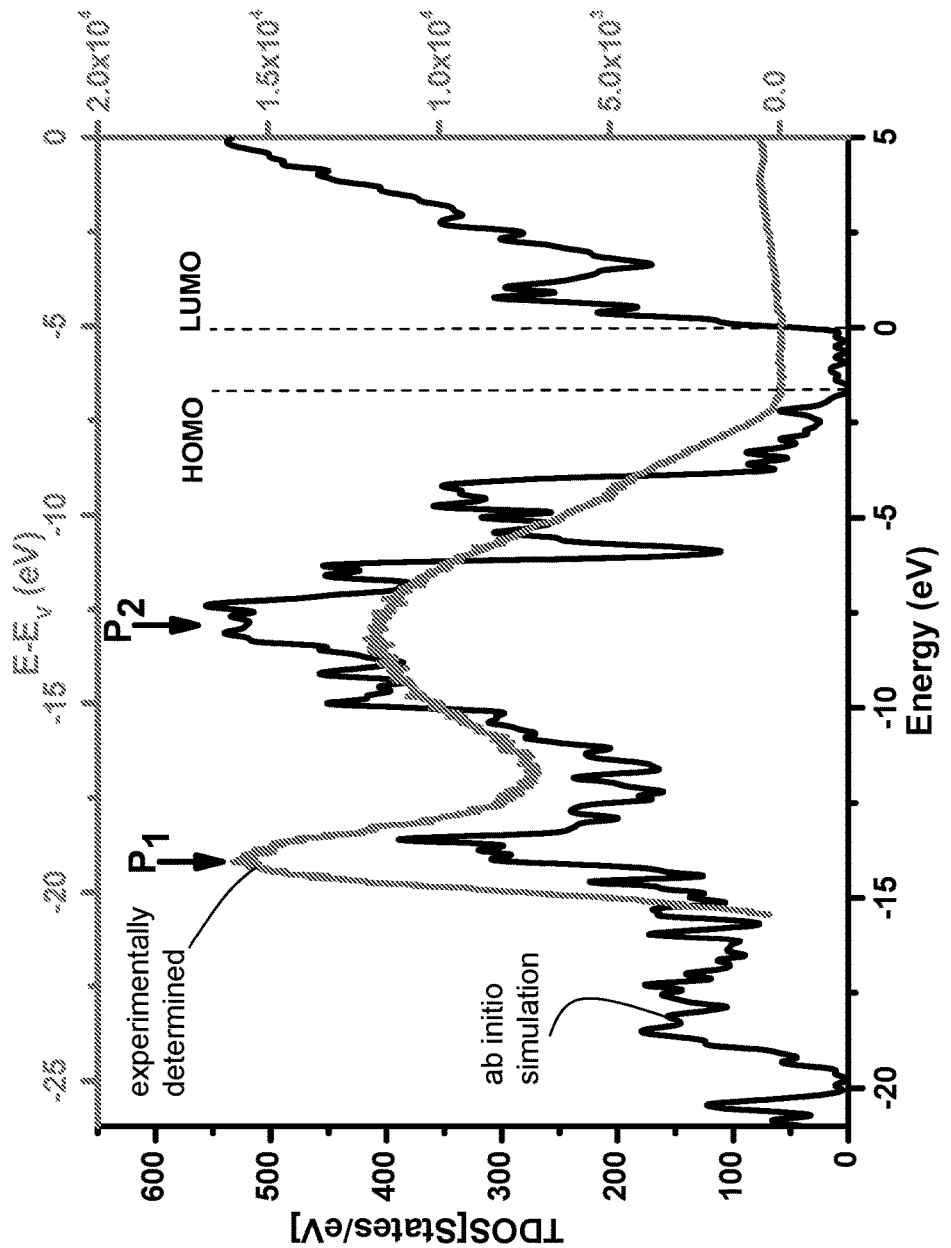
FIG. 10 shows the experimentally determined (via ultrafast photoemission spectroscopy) and calculated (via ab initio simulations) highest occupied molecular orbital (HOMO) edge and lowest unoccupied molecular orbital (LUMO) of pure Cyt c.

In order to understand the microscopic charge transport mechanism in s-SWCNT/Cyt c hybrid, the doping of the Cyt c on the carbon material was investigated. In particular, the source-drain current-gate voltage characteristics ($I_D$-$V_{BG}$) characteristics of graphene field-effect transistor (GFET) with or without Cyt c doping was measured (data not shown). A schematic of the GFET is shown in FIGS. 14A-14C. FIG. 14A shows the entire GFET, FIG. 14B illustrates the absorption of light by the Cyt c-doped/graphene film, and FIG. 14C depicts the energy band structure and band edge offset across the Cyt c/graphene interface. The $I_D$-$V_{BG}$ plots show that the Dirac point shifts to a more negative position when the Cyt c are adsorbed on the graphene surface, which indicates that the Cyt c give rise to an electron doping on the carbon material. The highest occupied molecular orbital (HOMO) edge of the pure Cyt c was also measured. As shown in FIG. 10, was observed that its HOMO edge locates at −7.24 eV. Therefore, the band-edge offset across the s-SWCNT/Cyt c interface for exciton dissociation can be plotted, as shown in FIG. 11. When light illuminates on the device, photoexcited electron-hole pairs are generated in the s-SWCNTs and dissociate at the interface of s-SWCNTs/Cyt c heterojunctions into free carriers to form photocurrent, resulting in enhanced photoconductivity as the photoresponse.

The current-bias voltage (I-V) characteristics of the s-SWCNT/Cyt c photodetector in response to illumination at various incident wavelengths with the same order of magnitude optical power ($P_{in}$) was examined (data not shown). A strong photoresponse was clearly demonstrated. Interestingly, the I-V curves show nonlinear which indicates rectifying properties, which is evidence that the heterojunctions enable exciton dissociation to photocurrent, instead of heat. The photocurrent under different excitation power changing over two orders of magnitude can be extracted from I-V curves by subtracting the dark current with light current (data not shown). The photocurrent strongly depends on excitation power and increases with the incident power. The photocurrent dependency on the power and voltage at excitation wavelength of 1,000 nm was clearly revealed (data not shown). It is significant that about two orders of magnitude increase is achieved with increasing bias voltage from 3 to 10 V.

The photoresponsivity $R_i$, defined as the ratio of photocurrent to excitation power ($I_{photo}/P_{ex}$), was calculated under different incident power (data not shown). It is clear that the $R_i$ first increases sharply at bias voltage below 3 V, and then rapidly reaches a saturation value with voltage over 4 V. Moreover, the $R_i$ increases as incident power decreases. The maximum $R_i$ are 188.7 and 46.5 A $W^{-1}$ under illumination at wavelength of 400 and 1000 nm, respectively. These high $R_i$ values observed on the s-SWCNT/Cyt c photodetectors are more than four orders of magnitude higher than that of previous reports and represents the best so far achieved on the CNT-based IR detectors. (See Yang, L. J., Wang, S., Zeng, Q. S., Zhang, Z. Y. & Peng, L. M. Carbon Nanotube Photoelectronic and Photovoltaic Devices and their Applications in Infrared Detection. *Small* 9, 1225-1236 (2013); Lu, R. T., Shi, J. J., Baca, F. J. & Wu, J. Z. High performance multiwall carbon nanotube bolometers. *J Appl Phys* 108 (2010); Lu, R. T., Li, Z. Z., Xu, G. W. & Wu, J. Z. Suspending single-wall carbon nanotube thin film infrared bolometers on microchannels. *Appl Phys Lett* 94 (2009); Pradhan, B., Kohlmeyer, R. R., Setyowati, K., Owen, H. A. & Chen, J. Advanced carbon nanotube/polymer composite infrared sensors. *Carbon* 47, 1686-1692 (2009); Bang, D. et al. Effectively enhanced sensitivity of a polyaniline-carbon nanotube composite thin film bolometric near-infrared sensor. *J Mater Chem* 22, 3215-3219 (2012); Lu, R. T., Christianson, C., Kirkeminde, A., Ren, S. Q. & Wu, J. D. Extraordinary Photocurrent Harvesting at Type-II Heterojunction Interfaces: Toward High Detectivity Carbon Nanotube Infrared Detectors. *Nano Lett* 12, 6244-6249 (2012).) It is worth mentioning that the high $R_i$ obtained in the s-SWCNT/Cyt c photodetectors is comparable with state-of-the-art quantum dots photodetectors. Without wishing to be bound to any particular theory, this ultrahigh $R_i$ may be attributed to the microstructure in s-SWCNT/Cyt c nanohybrid composite film where the ~3 nm Cyt c absorbed on SWCNT is similar to some quantum dots, having a huge specific surface area that is much larger than the actual macro area of measured film. Additionally, improved charge transport through the Cyt c molecular chains may provide further contributions to the $R_i$ in the s-SWCNT/Cyt c detectors. The time-dependent photoresponse of the s-SWCNT/Cyt c at 7 and 15 V bias under on-off light modulation by using frequency of 90 Hz and wavelength of 1,000 nm was also examined (data not shown). The response times of devices, calculated from 10% to 90% maximum photocurrent, for light on and off were 0.6 ms and 0.9 ms, respectively. Notably, the photoresponse of the s-SWCNT/Cyt c device is considerably faster than that of the pure SWCNT devices, or CNT-based IR bolometers. This symmetry means not only better photodetector performance, but also a reduced charge trapping effect.

The spectra density of noise power as functions of frequency by the dark current under various bias voltages were analyzed (data not shown). The noise can be fitted by $\overline{i_n^2} \propto 1/f$, which indicates that 1/f noise dominates the current noise behavior. The root mean square noise current RMS ($I_n$), that is $\overline{i_n^2}^{1/2}$ can be calculated from the noise spectra density (data not shown). The RMS($I_n$) increases linearly from $1.6 \times 10^{-11}$ to $1.8 \times 10^{-10}$ $AHz^{-1/2}$ with rising bias voltage from 1 to 20 V. The noise equivalent power (NEP), that is, the optical signal at which the output electrical signal-to-noise ratio is unity at bandwidth of 1 Hz, expressed with units of $W Hz^{-1/2}$. The calculated NEP under various light wavelengths from 400 to 1000 nm was plotted as functions of bias voltage (data not shown). At the wavelength of 400-700 nm, the NEP values locate at $-6-8 \times 10^{-13}$ $W HZ^{-1/2}$ over ~4 V bias. The NEP has a slight increase (~1.5-2.5× $10^{-13}$ $W Hz^{-1/2}$) for the NIR band (900-1000 nm) with respect to short wavelength range. This may be attributed to the Cyt c in nanohybrids involved in light absorption and photoelectric conversion due to the fact that Cyt c more strongly absorbs in the ultraviolet than the visible. The low NEP leads to high figure-of-merit special detectivity D*. The D* can be calculated by $D^* = (A)^{1/2}/NEP = R_i(A)^{1/2}/\overline{i_n^2}^{1/2}$, where A is the detection area with unit of $cm^2$. The D* under illumination with 1,000 nm wavelength at different incident power ranging over two orders of magnitude was plotted (data not shown). The best D* in the main panel is obtained as high as $~1 \times 10^{10}$ $cm Hz^{1/2}W^{-1}$ at the bias voltage over ~6 V under low light power from 0.06 to 0.23 μW. Results also showed that the maximum D* under lighting with 400 nm wavelength was more than $4 \times 10^{10}$ $cm Hz^{1/2}W^{-1}$.

Figure 12A:
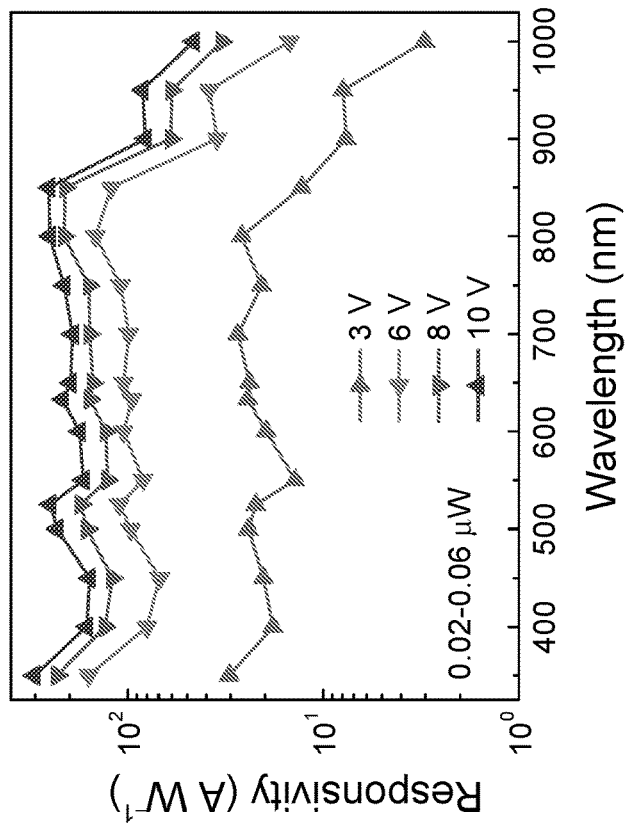
FIG. 12A plots the responsivity as a function of incident light power at 6 and 10 V bias voltage for a s-SWCNT/Cyt c film.
Figure 12B:
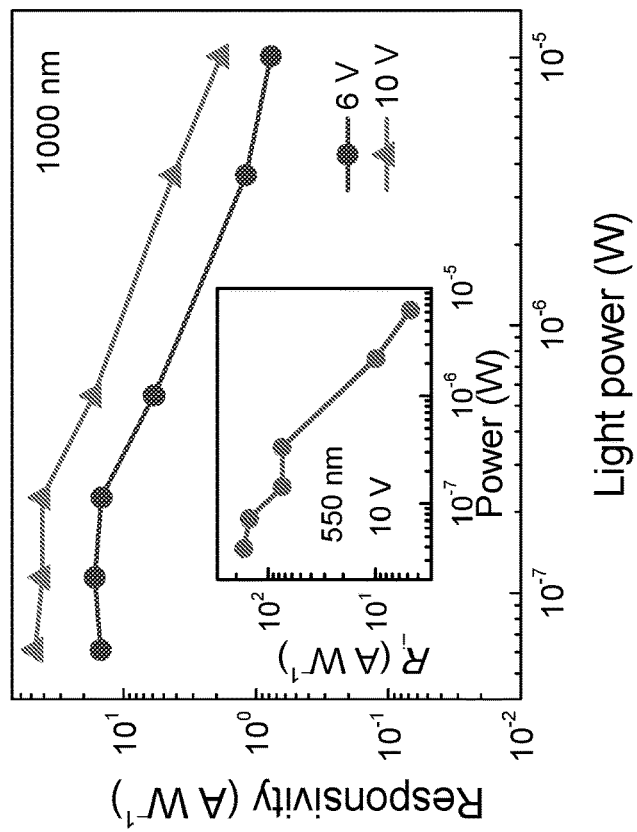
FIG. 12B plots the responsivity of the film over an ultra-broad wavelength range from 350 nm to 1000 nm at different bias voltages.

The $R_i$ as functions of illumination power at typical 1,000 nm NIR and 550 nm visible light are plotted in FIGS. 12A and 12B. It is clear that the $R_i$ strongly depends on the excitation power and the $R_i$ could reach saturation in power below 0.23 μW. Remarkably, the best $R_i$ under 550 nm-wavelength illumination is greater than 100 $A W^{-1}$ at 10 V bias voltage (inset in FIG. 12A). Moreover, the s-SWCNT/Cyt c devices show an ultra-broadband photoresponse. As shown in FIG. 12B, the $R_i$ under illumination in the wavelength range from 350 to 800 nm with low excitation power are greater compared with 800-1,000 nm lighting.

Figure 13A:
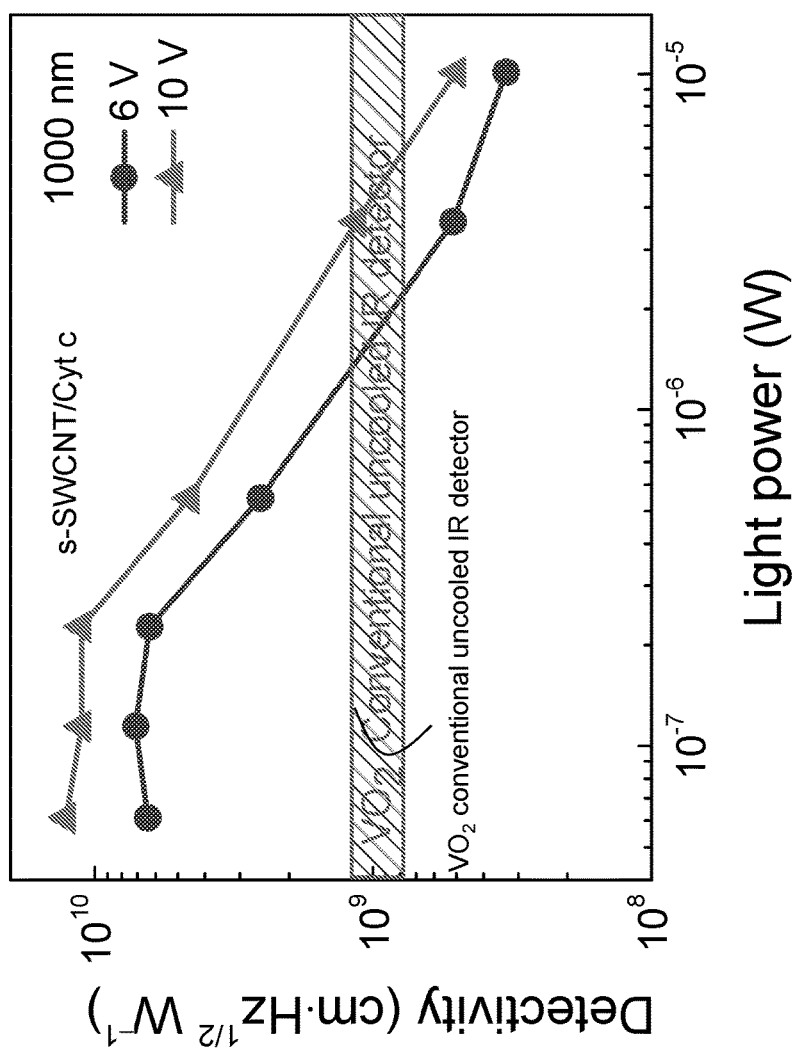
FIG. 13A plots the detectivity as a function of incident light power at 6 and 10 V bias voltage for a s-SWCNT/Cyt c film.
Figure 13B:
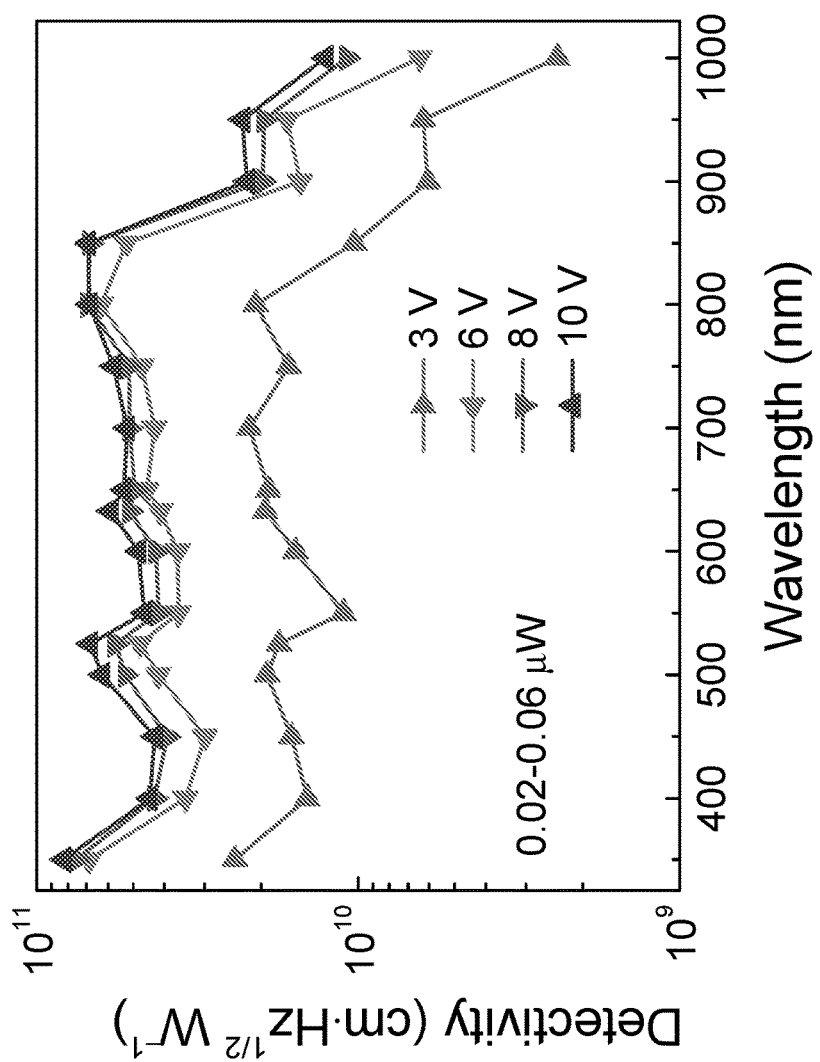
FIG. 13B plots the detectivity of the film over an ultra-broad wavelength range from 350 nm to 1000 nm at different bias voltages.

FIG. 13A shows the D* of s-SWCNT/Cyt c devices as functions of incident power at 1,000 nm lighting. The D* also shows a similar dependence on excitation power. It is noted that the D* is an order of magnitude higher than the commercial $VO_2$ uncooled IR detector with D* of $10^9$ $cm Hz^{1/2}W^{-1}$ (marked by cross-hatched box). As shown in FIG. 13B, the D* is relatively steady from 350 to 800 nm at the same bias voltage, while it slightly decreases from 800 to 1,000 nm wavelength. Noticeably, the D* is up to $~1-6 \times 10^{10}$ in the range of UV, visible to NIR band, which confirms that the s-SWCNT/Cyt c devices are ultra-broadband photodetectors with high detectivity.

Example 3: High-Responsivity Protein-Adsorbed Multi-Walled Carbon Nanotube Nanohybrid Photodetectors Methods Fabrication of the MWCNT/Cyt Films Photodetector.

Firstly, the Cyt (purity ≥95%) from equine heart were directly dissolved in DI water (very easily) to form a solution of 2 mg/ml. The Cyt solution was diluted by 10 times. The MWCNT (with diameter range from 10 to 15 nm) with surfactant triton also were dissolved in DI water to make a MWCNT solution with concentration of ~5 μg/ml. Then, the Cyt solution (1 ml) and the MWCNT solution (1 ml) were mixed together, followed by sonicating in a bath-type sonicator for 1-2 hours in order to form a uniform solution. Such a mixed solution was then kept static for 2-3 days in order to separate out the undissolved MWCNT or Cyt, or other impurities. To fabricate uniform MWCNT/Cyt films with high quality, the upper 80% of the suspension was further diluted 5 times with DI water. Finally, the MWCNT/Cyt thin films (400-450 nm thickness) were obtained by vacuum-filtrating the dilute suspension of the mixed solution onto a filtration membrane (100 ml), followed by washing with DI water for several times and drying at ~60° C. for 1-2 hours. Two Au/Ti electrodes (50 nm/10 nm thickness) with space of 0.35 mm were deposited onto the silicon substrate with 90 nm $SiO_2$ by electron-beam evaporation. MWCNT/Cyt film having a width of about 0.5 mm is transferred onto the substrate with the Au/Ti electrodes by dissolving the filtration membrane.

Photoresponse Measurements.

All measurements were carried out under room temperature and atmospheric conditions. To measure the photocurrent in accordance with the voltage source mode, the measured circuit was set up so that the MWCNT/Cyt device was connected in series with a constant resistor of 2 kΩ. Bias voltage was applied in the circuit using an Agilent E3631A voltage source, and the current was determined using a HP 34420A voltmeter by examining the voltage across a constant resistor in series. The illumination was provided by a xenon light with a NIR filter with 1.0-1.3 μm. The incident light power density was identified by a Thorlabs PM100D thermal power meter. Photoresponse switching at various modulation frequencies was measured by an Agilent 54624A oscilloscope combining with a mechanical chopper. The noise spectra at various bias voltages were obtained by a Stanford Research SR760 spectrum analyzer combining with the Agilent E3631A voltage source.

Results and Discussion

A schematic of the MWCNT/Cyt c nanocomposite is shown in FIG. 15A. The energy band structure of the nanocomposite across the interface is illustrated in FIG.

15B. The optical absorbance spectra of the pure MWCNT (50 µg/ml) and the MWCNT (50 µg/ml)/Cyt (200 µg/ml) solution were measured using a Cary 5000 ultraviolet-visible-NIR dual-beam spectrophotometer (data not shown). Similar to the results for s-SWCNT/Cyt c described in Example 1, the pure Cyt c is almost transparent in the NIR band and shows main three absorption peaks of at 408, 522 and 550 nm. The MWCNTs exhibit broadband absorption, in the range from 600 to 1200 nm. This indicates that the MWCNTs will contribute to photoexciton under NIR illumination.

Figure 16:
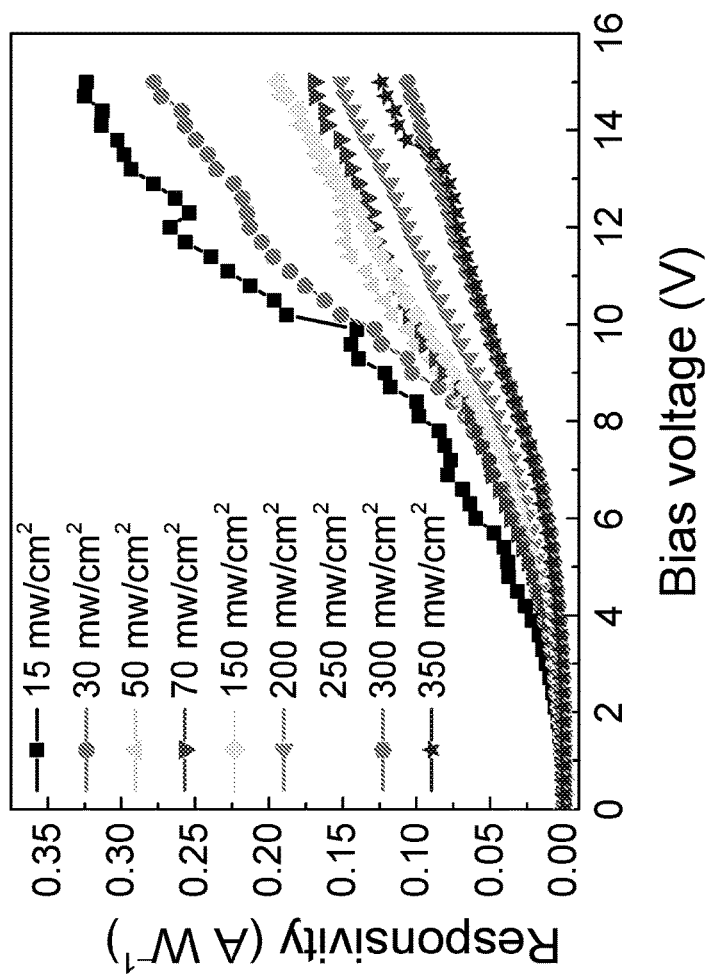
FIG. 16 plots the current of the MWCNT/Cyt c devices under NIR illumination as a function of bias voltage at various incident powers.

The current-voltage properties of the MWCNT/Cyt device was measured at a wavelength of 1050 nm light with various incident power density ranging from 15 to 350 mW/cm$^2$ (data not shown). The actual incident NIR power ($P_{in}$) can be calculated by the NIR power density multiplying by the irradiated sample area. The current of MWCNT/Cyt device shows a nonlinear bias voltage ($V_{bias}$) dependence, which is consistent with heterojunctions enabling exciton dissociation to photocurrent. The photocurrent ($I_{photo}$) can be extracted by the light current minus the dark current ($I_{dark}$). Strong photoresponse in the MWCNT/Cyt c device was observed which gradually increases with increasing the illumination power density. The bias-dependent responsivity was plotted as shown in FIG. 16. A high responsivity $R_i$ (0.32 AW$^{-1}$) calculated by $I_{photo}/P_{in}$ was obtained at bias voltage of 15 V under a low incident power density of 15 mW/cm$^2$. Remarkably, the $R_i$ value is significantly enhanced by two orders of magnitude with respect to previous CNT-based infrared detectors. (See R. T. Lu, C. Christianson, A. Kirkeminde, S. Q. Ren and J. D. Wu, Nano Lett 12 (12), 6244-6249 (2012).) This value is smaller than SWCNT/Cyt c due to the reduced specific surface area (assuming the same mass concentration). Additionally, the greater the amount of metallic CNTs in MWCNTs as compared to s-SWCNTs results in decreasing $R_i$ due to some invalid light absorption. The external quantum efficiency (EQE) is calculated by EQE=$(I_{photo}/e) \times (h/\lambda P_{in})$=$hR_i/\lambda e$=$1240R_i/\lambda$, where h is Planck's constant, $\lambda$ is the optical wavelength and the e is the electronic charge. Similar to the case of s-SWCNT/Cyt c (Example 1), the EQE increases with decreasing NIR light intensity and it also depends on the $V_{bias}$, which implies that the EQE can further increase if the test light intensity is reduced (data not shown). Under the current test conditions, the highest EQE (27.5%) of MWCNT/Cyt c photodetectors is obtained under NIR density of 15 mW/cm$^2$ at 15 V. The EQE of MWCNT/Cyt c devices is smaller than that of s-SWCNT/Cyt c devices, which is attributed to the reduced specific surface area and more metallic CNTs. However, the EQE of MWCNT/Cyt c devices is still higher than that (only 1.72%) of s-SWCNT/P3HT counterparts. (See R. T. Lu, C. Christianson, A. Kirkeminde, S. Q. Ren and J. D. Wu, Nano Lett 12 (12), 6244-6249 (2012).)

Figure 17:
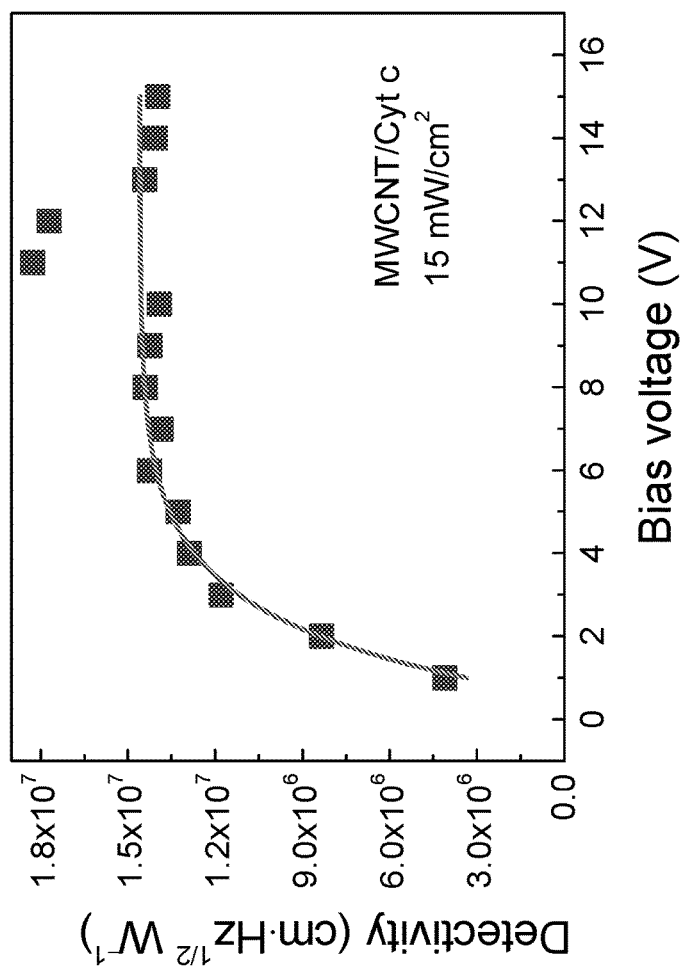
FIG. 17 plots the detectivity of the MWCNT/Cyt c devices as a function of bias voltage under an incident power of 15 mW/cm$^2$.

To clarify the sensitivity of the MWCNT/Cyt device, its noise spectra ($I_n$) was measured (data not shown). The $I_n$ of the devices monotonically decreases with increasing frequency, and it can be fitted by $I_n^2 \propto 1/f$, indicating that 1/f noise dominates the current noise behavior in low modulated frequency range. The noise equivalent power (NEP) is defined by NEP=$\overline{i_n^2}^{1/2}/R_i$, where the $\overline{i_n^2}$ is the mean square noise current calculated from the spectra density of noise power. The NEP decreases sharply with increasing bias ranging from 1 V to 3 V and subsequently reaches a stable value of 3.7×10$^{-9}$ W Hz$^{-1/2}$ when the bias voltage exceeds 3 V (data not shown). The MWCNT/Cyt c device exhibited a bias voltage dependence of root mean square noise current RMS($I_n$) $\overline{i_n^2}^{1/2}$ (data not shown). The RMS($I_n$) value increases from 2.3×10$^{-11}$ to 1.2×10$^{-10}$ AHz$^{-1/2}$ with increasing the bias voltage from 1 V to 15 V, which is comparable in order of magnitude with the s-SWCNT/Cyt c device (Example 1). The specific detectivity (D*) can be calculated by D*=(A)$^{1/2}$/NEP where A is the device area with unit of cm$^2$. Despite the $R_i$ increases with increasing bias, as shown in FIG. 17, D* initially increases with increasing bias and then reaches a saturation value (1.4×10$^7$ cm Hz$^{1/2}$W$^{-1}$) near the bias of ~6 V under incident power of 15 mW/cm$^2$ due to the bias-dependent $I_n$.

To study the dynamic photoresponse of the MWCNT/Cyt device, the photoresponse switching was measured by modulating input light at different frequency range from 2 to 100 Hz. Dynamic photoresponse of MWCNT/Cyt devices at bias voltages of 10 V at a modulation frequency of 97 Hz was obtained (data not shown). By calculating the across time from 10% to 90% maximum photocurrent, the response times for light on (1.82 ms) and off (2.58 ms), respectively, were obtained. The fast optical response further confirmed the contribution of MWCNT/Cyt heterojunctions to the exciton dissociation. The responsivity as functions of modulation frequency at two typical bias voltages of 7 and 10 V was also plotted (data not shown). The $R_i$ slightly decreases with increasing frequency at both of bias voltages and only drops by 20% ($V_{bias}$=10 V) and 30% ($V_{bias}$=7 V) as the frequency increases from 2 Hz up to 97 Hz. The $I_n$ at F=2 Hz is nearly one order of magnitude lower than that at F=97 Hz (data not shown), which enables the D* to increase with the rising the modulation frequency (data not shown). The D* calculated at $V_{bias}$=7 V is the highest compared to the other bias voltages over the whole modulation frequency range of 2-97 Hz (data not shown), and it is as high as 1.8×10$^7$ cm Hz$^{1/2}$W$^{-1}$ at F=97 Hz. Impressively, at the same time, the $R_i$ maintains at a notable value (0.26-0.34 AW$^{-1}$) at $V_{bias}$=7 V over the whole modulation frequency range, which is at least more than 2 orders of magnitude larger than previous reports on CNT-based photodetectors (See M. E. Itkis, F. Borondics, A. P. Yu and R. C. Haddon, Science 312 (5772), 413-416 (2006); R. T. Lu, J. J. Shi, F. J. Baca and J. Z. Wu, J Appl Phys 108 (8) (2010); R. T. Lu, Z. Z. Li, G. W. Xu and J. Z. Wu, Appl Phys Lett 94 (16) (2009); R. T. Lu, C. Christianson, A. Kirkeminde, S. Q. Ren and J. D. Wu, Nano Lett 12 (12), 6244-6249 (2012)) and even approaches that of traditional semiconductor photodetectors. (See X. T. Gan, R. J. Shiue, Y. D. Gao, I. Meric, T. F. Heinz, K. Shepard, J. Hone, S. Assefa and D. Englund, Nat Photonics 7 (11), 883-887 (2013); P. Chaisakul, D. Marris-Morini, J. Frigerio, D. Chrastina, M. S. Rouifed, S. Cecchi, P. Crozat, G. Isella and L. Vivien, Nat Photonics 8 (6), 482-488 (2014). This ultrahigh responsivity is attributed to the efficient exciton separation enabled by the MWCNT-Cyt heterojunction.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention.

The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An optoelectronic device comprising
a nanocomposite comprising a carbon nanostructure having a surface and a biomolecule adsorbed on the surface of the carbon nanostructure and forming a heterojunction at the interface of the carbon nanostructure and the biomolecule, the carbon nanostructure and the biomolecule each characterized by respective conduction band edges and valence band edges;
a first electrode in electrical communication with the nanocomposite; and
a second electrode in electrical communication with the nanocomposite,
wherein the conduction band edge offset, the valence band edge offset, or both, across the heterojunction is greater in energy than the binding energy of an exciton generated in the carbon nanostructure or the biomolecule upon the absorption of light such that the exciton dissociates at the heterojunction to an electron, which is injected into one of the carbon nanostructure and the biomolecule, and a hole, which is injected into the other of the carbon nanostructure and the biomolecule, wherein the nanocomposite is part of a film comprising a network of interconnected nanocomposites.

2. The optoelectronic device of claim 1, wherein the conduction band edge of the biomolecule is lower in energy than the conduction band edge of the carbon nanostructure.

3. The optoelectronic device of claim 2, further wherein the valence band edge of the biomolecule is lower in energy than the valence band edge of the carbon nanostructure.

4. The optoelectronic device of claim 1, wherein the biomolecule is at least partially wrapped around the surface of the carbon nanostructure to form a helical structure, the helical structure at least partially wrapped around the surface of the carbon nanostructure.

5. The optoelectronic device of claim 4, wherein the helical structure comprises more than one adsorbed biomolecule.

6. The optoelectronic device of claim 1, wherein the biomolecule is selected from proteins, oligonucleotides, double-stranded DNA, and double-stranded RNA.

7. The optoelectronic device of claim 6, wherein the biomolecule is the protein and the protein is cytochrome c.

8. The optoelectronic device of claim 1, wherein the carbon nanostructure is a cylindrical carbon nanostructure or graphene.

9. The optoelectronic device of claim 8, wherein the carbon nanostructure is the cylindrical carbon nanostructure and the cylindrical carbon nanostructure is a single-walled carbon nanotube or a multi-walled carbon nanotube.

10. The optoelectronic device of claim 1, wherein the biomolecule is cytochrome c and the carbon nanostructure is a cylindrical carbon nanostructure.

11. The optoelectronic device of claim 1, wherein the biomolecule is cytochrome c and the carbon nanostructure is a cylindrical carbon nanostructure.

12. The optoelectronic device of claim 11, wherein the optoelectronic device is a photonic type photodetector further comprising a meter configured to measure the current collected by the first and second electrodes upon illumination of the film with light.

13. The optoelectronic device of claim 1, wherein the carbon nanostructure is a cylindrical carbon nanostructure and the film is substantially free of bundled carbon nanostructures.

14. The optoelectronic device of claim 1, wherein the carbon nanostructure is a cylindrical carbon nanostructure and the volume percent of carbon nanostructures in the film is at least 10 vol %.

15. The optoelectronic device of claim 1, wherein the carbon nanostructure is a cylindrical carbon nanostructure and the thickness of the film is no more than about 200 nm.

16. The optoelectronic device of claim 1, wherein the film comprising the network of interconnected nanocomposites is one or more sheets of graphene, each sheet of graphene having distributed thereon a plurality of biomolecules, the biomolecule being one of the plurality of biomolecules.

17. An optoelectronic device comprising
a nanocomposite comprising a carbon nanostructure having a surface and a biomolecule adsorbed on the surface of the carbon nanostructure and forming a heterojunction at the interface of the carbon nanostructure and the biomolecule, the carbon nanostructure and the biomolecule each characterized by respective conduction band edges and valence band edges;
a first electrode in electrical communication with the nanocomposite; and
a second electrode in electrical communication with the nanocomposite,
wherein the conduction band edge offset, the valence band edge offset, or both, across the heterojunction is greater in energy than the binding energy of an exciton generated in the carbon nanostructure or the biomolecule upon the absorption of light such that the exciton dissociates at the heterojunction to an electron, which is injected into one of the carbon nanostructure and the biomolecule, and a hole, which is injected into the other of the carbon nanostructure and the biomolecule, wherein the optoelectronic device is a photonic type photodetector further comprising a meter configured to measure the current collected by the first and second electrodes upon illumination of the nanocomposite with light.

18. The optoelectronic device of claim 17, characterized by a photoresponsivity Ri of at least $0.1$ $AW^{-1}$ at a light intensity of 15 $mW/cm^2$, a bias voltage of about 14 V and a wavelength in the range of from about 1 μm to about 1.3 μm; a detectivity D* at room temperature of at least $10^7$ $cmHz^{1/2}$ $W^{-1}$ at a light intensity of 15 $mW/cm^2$ and a bias voltage of about 6 V; or both.

19. A method comprising
illuminating an optoelectronic device with light, the optoelectronic device comprising
a nanocomposite comprising a carbon nanostructure having a surface and a biomolecule adsorbed on the surface of the carbon nanostructure and forming a heterojunction at the interface of the carbon nanostructure and the biomolecule, the carbon nanostructure and the biomolecule each characterized by respective conduction band edges and valence band edges;
a first electrode in electrical communication with the nanocomposite; and
a second electrode in electrical communication with the nanocomposite, wherein the conduction band edge offset, the valence band edge offset, or both, across the heterojunction is greater in energy than the binding energy of an exciton generated in the carbon nanostructure or the biomolecule upon the absorption of light such that the exciton dissociates at the heterojunction to an electron, which is injected into one of the carbon nanostructure and the biomolecule, and a hole, which is injected into the other of the carbon nanostructure and the biomolecule; and separately collecting the electron and the hole via the first and second electrodes.

20. The method of claim 19, wherein the optoelectronic device is a photonic type photodetector and the method further comprises measuring current collected by the first and second electrodes.

21. The method of claim 19, wherein the carbon nanostructure is a cylindrical carbon nanostructure or graphene and the biomolecule is cytochrome c.

* * * * *

UNITED STATES PATENT AND TRADEMARK OFFICE
CERTIFICATE OF CORRECTION

PATENT NO. : 10,224,499 B2
APPLICATION NO. : 15/547914
DATED : March 5, 2019
INVENTOR(S) : Judy Z. Wu et al.

Page 1 of 1

It is certified that error appears in the above-identified patent and that said Letters Patent is hereby corrected as shown below:

In the Specification

Column 12, Line 19:
Delete the phrase "up to 0.77 A due to" and replace with --up to 0.77 A W$^{-1}$--.

Column 16, Line 34:
Delete the phrase "$\overline{i_n\ 2}$" and replace with --$\overline{i_n^2}$--.

Column 16, Line 41:
Delete the phrase "$\overline{i_n\ 2}$" and replace with --$\overline{i_n^2}$--.

Column 16, Line 43:
Delete the phrase "$\overline{i_n\ 2} \infty 1/f$" and replace with --$\overline{i_n^2} \infty 1/f$--.

Column 21, Line 29:
Delete the phrase "$\overline{i_n\ 2} \infty 1/f,$" and replace with --$\overline{i_n^2} \infty 1/f,$--.

Column 21, Line 41:
Delete the phrase "–6 – 8 × 10$^{-13}$ W Hz$^{-1/2}$" and replace with --~6 – 8 × 10$^{-13}$ W Hz$^{-1/2}$--.

Column 23, Line 62:
Delete the phrase "$\overline{i_n\ 2}$" and replace with --$\overline{i_n^2}$--.

Signed and Sealed this
Fourth Day of June, 2019

Andrei Iancu
*Director of the United States Patent and Trademark Office*